United States Patent
Henry et al.

(10) Patent No.: US 11,641,463 B2
(45) Date of Patent: May 2, 2023

(54) METHOD AND DEVICE FOR CODING AND DECODING AN IMAGE BY BLOCK CUTTING INTO ZONES

(71) Applicant: FONDATION B-COM, Cesson-Sevigne (FR)

(72) Inventors: Félix Henry, Saint-Grégoire (FR); Gordon Clare, Pacé (FR); Pierrick Philippe, Melesse (FR)

(73) Assignee: FONDATION B-COM, Cesson-Sevigne (FR)

( * ) Notice: Subject to any disclaimer, the term of this patent is extended or adjusted under 35 U.S.C. 154(b) by 0 days.

(21) Appl. No.: 17/291,813

(22) PCT Filed: Nov. 6, 2019

(86) PCT No.: PCT/EP2019/080369
§ 371 (c)(1),
(2) Date: May 6, 2021

(87) PCT Pub. No.: WO2020/094703
PCT Pub. Date: May 14, 2020

(65) Prior Publication Data
US 2021/0392320 A1    Dec. 16, 2021

(30) Foreign Application Priority Data

Nov. 9, 2018    (FR) ...................................... 1860360

(51) Int. Cl.
*H04N 19/105*    (2014.01)
*H04N 19/119*    (2014.01)
(Continued)

(52) U.S. Cl.
CPC ............. *H04N 19/105* (2014.11); *G06T 9/00* (2013.01); *H03M 7/3044* (2013.01);
(Continued)

(58) Field of Classification Search
CPC .. H04N 19/105; H04N 19/119; H04N 19/159; H04N 19/167; H04N 19/176;
(Continued)

(56) References Cited

U.S. PATENT DOCUMENTS 8,244,049 B2    8/2012  Lee et al.
9,253,508 B2    2/2016  Gao et al.
(Continued)

FOREIGN PATENT DOCUMENTS

EP    1589769 A1    10/2005
WO    2014055745 A1    4/2014
(Continued)

OTHER PUBLICATIONS

Mathias Wien, "High Efficiency Video Coding, Coding Tools and Specification", Signals and Communication Technology, DOI: 10.1007/978-3-662-44276-0, dated 2015.
(Continued)

*Primary Examiner* — Tat C Chio
(74) *Attorney, Agent, or Firm* — David D. Brush; Westman, Champlin & Koehler, P.A.

(57) ABSTRACT

A method for encoding or decoding at least one image, an image being split into blocks of elements. The method includes, for at least one block: splitting the block into at least two areas; and processing at least one of the areas. The processing includes scanning the elements of the area according to a predetermined scanning order, and for at least one scanned element, called a current element: selecting at least one predictor element previously encoded or decoded according to a prediction function; and predicting the current element: from the at least one predictor element, if the at least one predictor element belongs to the area; or from at least one replacement value, otherwise.

16 Claims, 18 Drawing Sheets

(51) Int. Cl.

| | | |
|---|---|---|
| *H04N 19/159* | (2014.01) | |
| *H04N 19/167* | (2014.01) | |
| *H04N 19/176* | (2014.01) | |
| *H04N 19/593* | (2014.01) | |
| *G06T 9/00* | (2006.01) | |
| *H03M 7/36* | (2006.01) | |
| *H03M 7/30* | (2006.01) | |

(52) U.S. Cl.
CPC ....... *H03M 7/3064* (2013.01); *H03M 7/6005* (2013.01); *H03M 7/6011* (2013.01); *H04N 19/119* (2014.11); *H04N 19/159* (2014.11); *H04N 19/167* (2014.11); *H04N 19/176* (2014.11); *H04N 19/593* (2014.11)

(58) Field of Classification Search
CPC .. H04N 19/593; H04N 19/157; H04N 19/182; H04N 19/436; H04N 19/129; G06T 9/00; H03M 7/3044; H03M 7/3064; H03M 7/6005; H03M 7/6011
See application file for complete search history.

(56) References Cited

U.S. PATENT DOCUMENTS

| | | | | |
|---|---|---|---|---|
| 2012/0106646 | A1* | 5/2012 | Cammas | H04N 19/176 375/240.18 |
| 2014/0359595 | A1* | 12/2014 | Sehgal | G06F 8/65 717/171 |
| 2017/0359595 | A1* | 12/2017 | Zhang | H04N 19/176 |

FOREIGN PATENT DOCUMENTS

| | | |
|---|---|---|
| WO | 2015057947 A1 | 4/2015 |
| WO | 2015057947 A8 | 6/2016 |

OTHER PUBLICATIONS

International Search Report dated Jan. 15, 2020 for corresponding International Application No. PCT/EP2019/080369, Nov. 6, 2019.
Written Opinion of the International Searching Authority dated Jan. 15, 2020 for corresponding International Application No. PCT/EP2019/080369, filed Nov. 6, 2019.
Naccari M et al. "Complexity reduction for residual DPCM in HEVC lossless coding" 104. MPEG Meeting; Apr. 22, 2013-Apr. 26, 2013; Incheon; (Motion Picture Expert Group or ISO/IEC JTC1/SC29/WG11), No. m29413, Apr. 21, 2013 (Apr. 21, 2013), XP030057945.
Joshi et al. "Non-RCE2: Extension of residual DPCM for lossless coding" 13. JCT-VC Meeting; 104 MPEG Meeting; Apr. 18, 2013-Apr. 26, 2013; Incheon; (Joint Collaborative Team on Video Coding of ISO/IEC JTC1/SC29/WG11 and ITU-T SG.16); URL: HTTP://WFTP3.ITU.INT/AV-ARCH/JCTVC-SITE/, No. JCTVC-M0288, Apr. 9, 2013 (Apr. 9, 2013), XP030114245.
Lee S et al: "RCE2: Test 1—Residual DPCM for HEVC lossless coding", 13. JCT-VC Meeting; 104. MPEG Meeting; Apr. 18, 2013-Apr. 26, 2013; Incheon; (Joint Collaborative Team on Video Coding of ISO/IEC JTC1/SC29/WG11 and ITU-T SG.16); URL: HTTP://WFTP3.ITU.INT/AV-ARCH/JCTVC-SITE/ No. JCTVC-M0079, Apr. 8, 2013 (Apr. 8, 2013), XP030114036.
International Search Report dated Jan. 21, 2020 for corresponding International Application No. PCT/EP2019/080374, Nov. 6, 2019.
Written Opinion of the International Searching Authority dated Jan. 21, 2020 for corresponding International Application No. PCT/EP2019/080374, filed Nov. 6, 2019.
French Search Report and Written Opinion dated Jun. 24, 2019 for corresponding French Application No. 1860360, filed Nov. 9, 2018.
"Information technology—Lossless and near-lossless compression of continuous-tone still images—Baseline", Series T: Terminals for Telematic Services, ITU-T Recommendation T.87, ISO/OEC 14495-1:1999, Jun. 18, 1998.
English translation of the Written Opinion of the International Searching Authority dated Jan. 23, 2020 for corresponding International Application No. PCT/EP2019/080369, filed Nov. 6, 2019.
English translation of the Written Opinion of the International Searching Authority dated Feb. 3, 2020 for related International Application No. PCT/EP2019/080374, filed Nov. 6, 2019.

* cited by examiner

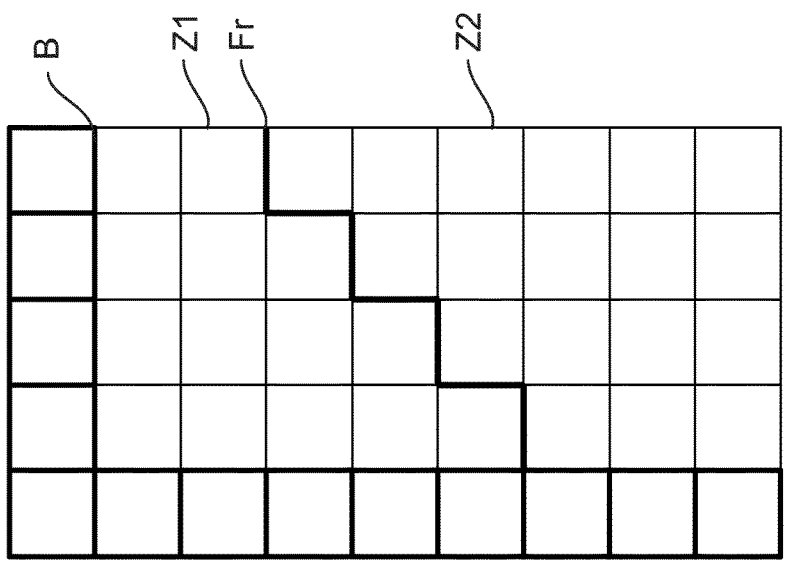

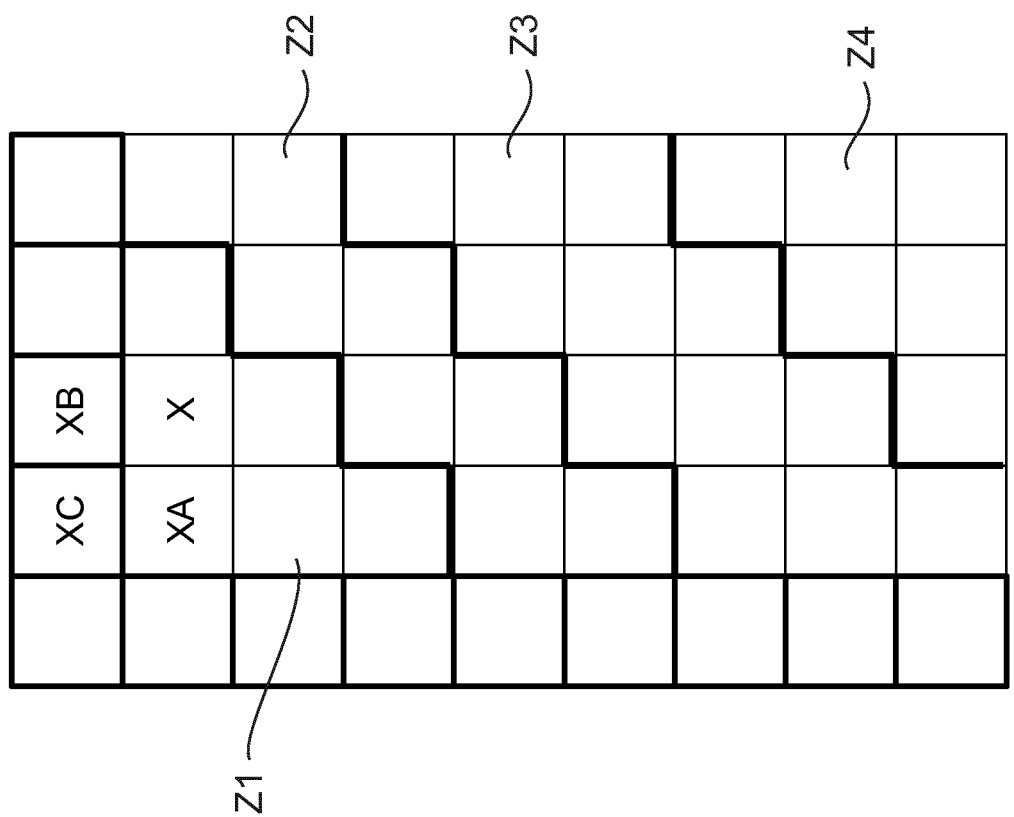
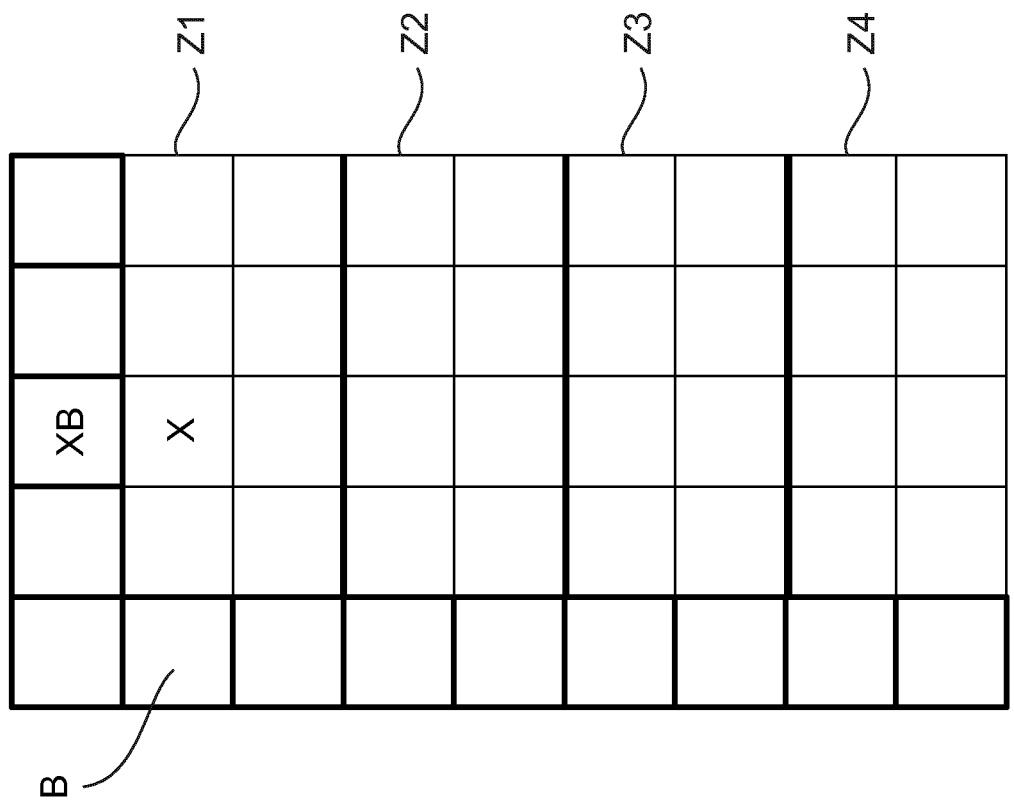
Fig. 7B
Fig. 7A 0.12 cycle/px 0.23 cycle/px 0.44 cycle/px 0.25 cycle/px 0.18 cycle/px 0.25 cycle/px 0.18 cycle/px

METHOD AND DEVICE FOR CODING AND DECODING AN IMAGE BY BLOCK CUTTING INTO ZONES

CROSS-REFERENCE TO RELATED APPLICATIONS

This Application is a Section 371 National Stage Application of International Application No. PCT/EP2019/080369, filed Nov. 6, 2019, which is incorporated by reference in its entirety and published as WO 2020/094703 A1 on May 14, 2020, not in English.

1. FIELD OF THE INVENTION

The field of the invention pertains to encoding and decoding of images or sequences of images, and in particular video streams.

More specifically, the invention relates to compression of images or sequences of images using a representation of the images by blocks.

In particular, the invention may apply to images or video encoding implemented in current or upcoming encoders (JPEG, MPEG, H.264, HEVC, etc. and VVC and their amendments), and in the corresponding decoders.

2. PRIOR ART AND ITS DRAWBACKS

Digital images and sequences of images occupy a huge amount of memory space, which requires, when these images are transmitted, compressing them in order to avoid congestion problems on the network used for this transmission. Indeed, the usable rate on this network is limited in general.

Numerous techniques for compressing video data are already known. Among these, the HEVC ("High Efficiency Video Coding, Coding Tools and Specification", Matthias Wien, Signals and Communication Technology, 2015) compression standard suggests implementing a prediction of pixels of a current image with regards to other pixels belonging to the same image (intra prediction) or to a previous or next image (inter prediction).

More specifically, the intra prediction makes use of spatial redundancies within an image. For this purpose, the images are split into blocks of elements or pixels. The blocks of pixels are then predicted using already rebuilt information, corresponding to the previously encoded/decoded blocks in the current image according to the order of scanning the blocks in the image.

Moreover, conventionally, encoding of a current block is carried out using a prediction of the current block, called predicted block, and a prediction residue or "residual block", corresponding to the difference between the current block and the predicted block. The obtained residual block is then transformed, for example using a DCT (discrete cosine transform) type transform. Afterwards, the coefficient of the transformed residual block are quantized, and then encoded by an entropic encoding and transmitted to the decoder, which can rebuild the current block by adding this residual block to the predicted block.

Decoding is done image by image, and for each image, block by block. For each block, the corresponding elements of the stream are read. The reverse quantization and the reverse transformation of the coefficients of the residual block are performed. Then, the prediction of the block is calculated to obtain the predicted block and the current block is rebuilt by adding the prediction (the predicted block) to the decoded residual block.

A technique for predicting the elements of a block, called DPCM (standing for "Differential Pulse Code Modulation"), is also known which consists in predicting the value of a pixel of an image from that/those of one or several ones of its neighbours. For example, this technique is applied to the JPEG-LS (standing for "Lossless Joint Photographic Expert Group") standard and described in the document ISO/OEC 14495-1:1999 ITU-T Rec. T.87, in 1998.

Referring to FIG. 1, consider an element or pixel X of an image I. This element is placed on the row lin and the column col of the image I. The elements of this block are processed according to a so-called "lexicographic" scanning order of the image, that is to say from the left to the right on one row, and then row by row from the top to the bottom. The pixel X is surrounded by three already decoded neighbouring pixels, which are the pixel XA located on the same row to its left, the pixel XB located on the same column above it and the pixel XC located in diagonal, above it and to its left.

A prediction of the value of X is referred to as P(X). According to the JPEG-LS standard, P(X) is calculated as follows:

$$P(X) = f(XA, XB, XC),$$

where f is a predetermined function, that will be referred to later on as neighbouring function.

An example of a function f is indicated hereinbelow:

$$f(A, B, C) = \min(A, B) \text{ if } C \geq \max(A, B)$$
$$\max(A, B) \text{ if } C \geq \min(A, B)$$
$$A + B - C \text{ otherwise}$$

This function f is that one used in the JPEG-LS standard.

Once this prediction P(X) is calculated, an original prediction residue R(X) is determined by subtraction of the prediction of the pixel X from the original value of X:

$$R(X) = X - P(X).$$

In the case of an encoding without image loss like that one specified by JPEG-LS, this residue R(X) is encoded by an entropic encoder which makes use of its statistical properties, and then transmitted to the decoder.

In the case of an encoding with image loss, the residue R(X) is typically quantized, for example using a uniform scalar quantizer with a quantization step ? set by the user:

$$RQ(X) = NI(R(X)/d)$$

Where NI (standing for "Nearest Integer") is the function that determines the closest integer. It selects the smallest one in case of equality.

The quantized residue RQ(X) is compressed beforehand using an entropic encoding technique such as Huffman encoding or arithmetic encoding, known to those skilled in the art, and is then transmitted to the decoder. On the encoder side, the decoded value D(X) of the current pixel X is rebuilt, so that the current pixel could serve as a predictor to pixels that are processed subsequently. The decoded version of the current pixel D(X) may be expressed as follows:

$$D(X) = P(X) + R\_Q(X) \cdot d$$

The decoder applies the same formula to rebuild the samples of the signal carrying the encoded data transmitted by the encoder.

It should be noted that pixels other than the neighbouring pixels XA, XB and XC of the pixel X, determined by prediction functions other than the JPEG-LS function, may be used to predict the pixel X, as long as these pixels are available in their decoded form. Similarly, it is possible to use any quantizer known to those skilled in the art.

It should be noted that, when a DPCM-type prediction is applied to an image, some pixels X have no predictor as defined by the function f. This is the case, in the previous example, of the pixels of the first row of pixels of the image and of the first column. A known solution consists in assigning a default value to XA, XB or XC such as the median value of the dynamics of the signal, like 128 for a signal that can range between 0 and 255.

From the document published under the number U.S. Pat. No. 9,253,508 in February 2016, an adaptation of this DPCM prediction technique to a bloc-based coding scheme is also known. Thus, inside a block B of the image, for example 8×8 pixels sized, the pixels are scanned in the lexicographic order and the DPCM prediction as described before is applied. Typically, when the pixels XA, XB or XC that are used in calculating the prediction of a pixel X are outside the current block, the values of the decoded pixels originating from the neighbouring blocks are used, for example XC', XB' or XC", XB" as illustrated in FIG. 1B.

An experiment of the DPCM technique at the block level implemented by the inventors has revealed a gain in compression of the video, in particular on some types of contents such as synthetic contents.

Nonetheless, the DPCM technique has the drawback of imposing a serial processing of the pixels. This results in the consumption of an increased number of machine cycles for processing one DPCM block. Yet, a video encoder and decoder are subject to more stringent speed constraints than a fixed image encoder-decoder like JPEG-LS.

Hence, there is a need for a pixels prediction technique devoid of the drawbacks of the prior art and allowing in particular reducing the number of machine cycles required for processing one block.

3. DISCLOSURE OF THE INVENTION

According to at least one embodiment, the invention relates to a method for encoding or decoding at least one image, an image being split into blocks of elements, said method comprising, for at least one block:
  splitting of the block into at least two areas;
  processing of at least one said area, comprising scanning of the elements of the area according to a predetermined scanning order, and for at least one scanned element, called current element:
    selection of at least one predictor element previously encoded or decoded according to a prediction function;
    prediction of the current element:
      from the at least one predictor element, if the at least one predictor element belongs to said area;
      from at least one replacement value obtained independently of the at least one other area, otherwise.

The invention is based on a quite new approach, which consists in splitting a current block into at least two areas that are predicted independently of each other. When during the processing of one area, a predictor falls within the other area, it is replaced with a replacement value. This way, the two areas are independently encodable or decodable. Hence, in contrast with the prior art, they can be processed in parallel, which allows reducing the number of machine cycles required for encoding the current block.

According to a first embodiment of the invention, the current element X being located on a row lin and a column col, the prediction function selects the previously encoded or decoded element XB located on the same column and on the previous row and the boundary between said at least two areas is horizontal.

One advantage of such a vertical prediction is that it enables a horizontal splitting that is simple to implement, while enabling the simultaneous processing of all of the elements of one row of each area.

According to an aspect of this first embodiment of the invention, for a block comprising H rows, the current block is split into a first area and a second area, such that the elements of the first area meet the condition lin<H/2.

One advantage lies in forming two areas that require the same number of processing iterations or machine cycles, reduced by half in comparison with the prior art.

According to a second embodiment of the invention, the current element being located on a row lin and a column col, the prediction function selects the previously encoded or decoded element XB located on the same row and on the previous column and the boundary between said at least two areas is a vertical line.

One advantage of such a horizontal prediction is that it enables a vertical splitting of the block that is simple to implement, while enabling the simultaneous processing of all of the elements of one column of each area.

According to an aspect of this second embodiment of the invention, for the block comprising W columns, the current block is split into a first area and a second area, such that the elements of the first area meet the condition col<W/2.

One advantage lies in forming two areas with same dimensions which require the same number of processing iterations or machine cycles, reduced by half in comparison with the prior art.

According to a third embodiment of the invention, the current element being located on a row lin and a column col, the prediction function selects a previously processed first element on the same row and on the previous column, a previously processed second element on the previous row and on the same previous column and a previously processed third element on the previous row and column and the boundary is diagonal.

All of the elements of the same diagonal of the area can be processed simultaneously. One advantage lies in enabling resort to the so-called JPEG-LS prediction which allows for a proper consideration of the neighbourhood for the prediction of the current element, while maximising the number of elements ready to be predicted during the same iteration.

According to an aspect of this third embodiment, for a block comprising H rows and W columns, the current block is split into two areas, such that the elements of the first area meet the condition lin+col<(H+W)/2+1.

One advantage is the formation of two areas the processing of which requires almost the same number of iterations.

According to another embodiment of the invention, when the predictor element belongs to another area, the replacement value is a predetermined value read in a memory.

One advantage of this solution is that it is simple to implement.

According to another embodiment of the invention, the at least one replacement value is obtained from at least one other predictor element, selected in a previously encoded or decoded block in the vicinity of the current block.

Whether the predictor falls within a neighbouring block or within another area of the current block, a replacement predictor element is selected in a block in the vicinity of the current block, for example in the so-called reference elements, adjoining the boundary of the neighbouring block with the current block. One advantage of selecting the replacement value in the vicinity of the current block lies in guaranteeing a good-quality prediction.

According to an aspect of this embodiment of the invention, the other predictor element is selected in said neighbouring block on the same row or on the same column as the predictor element.

One advantage of this embodiment is that it preserves the directions of the prediction function.

According to another aspect of this embodiment of the invention, the other selected predictor element is the element of the neighbouring block that is the closest to the predictor element on the same row or on the same column.

One advantage lies in selecting the closest replacement predictor. In this manner, a good prediction quality is guaranteed.

According to another embodiment of the invention, the method comprises the obtainment of the prediction function in a list of available prediction functions, and at least the splitting of the current block into areas or the processing of at least one area depends on the obtained prediction function.

One advantage lies in using the best prediction function for the current block, for example according to a rate-distortion criterion, and in adapting splitting of the block to the selected prediction function.

According to still another embodiment of the invention, the at least one replacement value is a value determined for the current block such as the average value of the intensities of the elements of the current block.

One advantage is the determination and use by the encoder of a replacement value that is suited to the current block. This value is encoded and then transmitted to the decoder or provided to a decoder that is internal to the encoder.

According to an aspect of this embodiment of the invention, the encoding method comprises encoding of an indicator of the obtained prediction function.

Advantageously, on the encoder side, this indicator of the selected prediction function is encoded to be transmitted to the decoder, so that it could take it into account to process the current block.

For example, the encoded information may be in the form of a rank of the prediction function in a predetermined list known to the decoder.

According to another embodiment of the invention, said method comprises, for the scanned current element:
  obtainment of a residue element by subtraction of the predicted element from the current element;
  encoding of the residue element and insertion of the encoded residue element in encoded data representative of said image.

On the encoder side, all of the steps of encoding an area split in the current block according to the invention can thus be carried out independently of the encoding of the other area(s).

According to an embodiment of the method for encoding or decoding at least one image according to the invention, the at least one replacement value for the current block is encoded and transmitted in encoded data or obtained by reading encoded data.

One advantage is that the decoder obtains the replacement value selected by the encoder for the current block.

According to another embodiment of the decoding method according to the invention, the method comprises decoding of encoded data representative of an indicator of the prediction function, the prediction function being obtained from the indicator.

The decoder makes use of the encoded information to obtain the prediction function to be used for the current block. Advantageously, it deduces the most suitable splitting associated to this prediction function, for example according to predetermined rules or information read in memory. Advantageously, the decoded information may for example be in the form of a rank of the prediction function in a predetermined list known to the decoder.

According to still another embodiment of the decoding method according to the invention, said method comprising, for the current element,
  obtainment of a residue of the current element by reading encoded data representative of said image; and
  rebuilding of a decoded current element from the obtained residue and the predicted current element.

On the decoder side, all of the steps of decoding an area split in the current block according to the invention can thus be carried out independently of the decoding of the other area(s).

The invention also relates to a device for encoding or decoding at least one image adapted to implement an encoding or decoding method according to any one of the particular embodiments defined hereinabove. Of course, this device may include the different features relating to the encoding, respectively decoding, method according to the invention. Thus, the features and advantages of this device are the same as those of the encoding, respectively decoding, method and are not detailed further.

According to an embodiment of the invention, the current block being split into at least one first and one second areas, the encoding or decoding device comprises at least one first computing machine dedicated or configured to process the first area and one second computing machine dedicated or configured to process the second area.

This way, processing of these two areas can be carried out in parallel.

According to an aspect of this embodiment of the invention, the first and second computing machines of the device are dedicated and configured to process the elements of one row, of one column or of one diagonal of the block in one machine cycle.

One advantage lies in reducing even more the number of machine cycles required for processing each area of the block.

According to one embodiment, the invention also relates to a signal carrying encoded data representative of at least one image, an image being split into blocks, said encoded data having been obtained by an encoding method according to the invention, a block, called current block, being split into at least two areas, said encoded data comprise for one block at least one replacement value determined by said encoding method and intended to be used by a decoding method according to the invention to predict a current element of at least one said area of the block from said replacement value.

According to another embodiment, the invention further relates to a signal carrying encoded data representative of at least one image, an image being split into blocks, said encoded data having been obtained by an encoding method according to the invention, at least one block being split into at least two areas, said encoded data comprise for the block at least one indicator of a prediction function selected by the encoding method and intended to be used by a decoding method according to the invention to split a current element into at least two areas and to predict a current element of one said area according to said prediction function.

According to a particular embodiment, the invention also relates to one or several computer program(s) including instructions for the implementation of a method for encoding or decoding at least one image according to any one of the previously-described particular embodiments, when said program is executed by a processor. Such a program may use any programming language and be in the form of a source code, an object code, or an intermediate code between a source code and an object code, such as in a partially compiled form, or in any other desirable form. It may be downloaded from a communication network and/or recorded on a computer-readable medium.

The invention also covers a computer-readable recording medium or information medium, including instructions of a computer program as mentioned hereinabove. The aforementioned recording medium may consist of any entity or device capable of storing the program. For example, the medium may include a storage means, such as a ROM, for example a CD ROM or a ROM of a microelectronic circuit, or a magnetic recording means, for example a USB flash disk or a hard disk.

Besides, the recording media may correspond to a transmittable medium such as an electric or optical signal, which may be conveyed via an electrical or optical cable, by radio or by other means. In particular, the program according to the invention may be downloaded on an Internet-type network.

Alternatively, the recording media may correspond to an integrated circuit in which the program is embedded, the circuit being adapted to execute or to be used in the execution of the considered method.

4. LIST OF THE FIGURES

Other objects, features and advantages of the invention will appear more clearly upon reading the following description, provided merely as an illustrative and non-limiting example, with reference to the figures, among which:

FIGS. 1A and 1B illustrate the DPCM prediction technique applied to an image and to a block of an image according to the prior art;

FIG. 2 schematically describes the main steps to process a block of an image according to the invention;

FIGS. 4A to 4D illustrate an order of processing the elements of a block for different splits and prediction functions implemented according to the invention;

FIGS. 5A to 5C illustrate a variant of the invention, implementing the JPEG-LS prediction function and a diagonal splitting;

FIGS. 7A and 7B illustrate examples of splits of blocks into more than two areas according to the invention;

Figure 9:
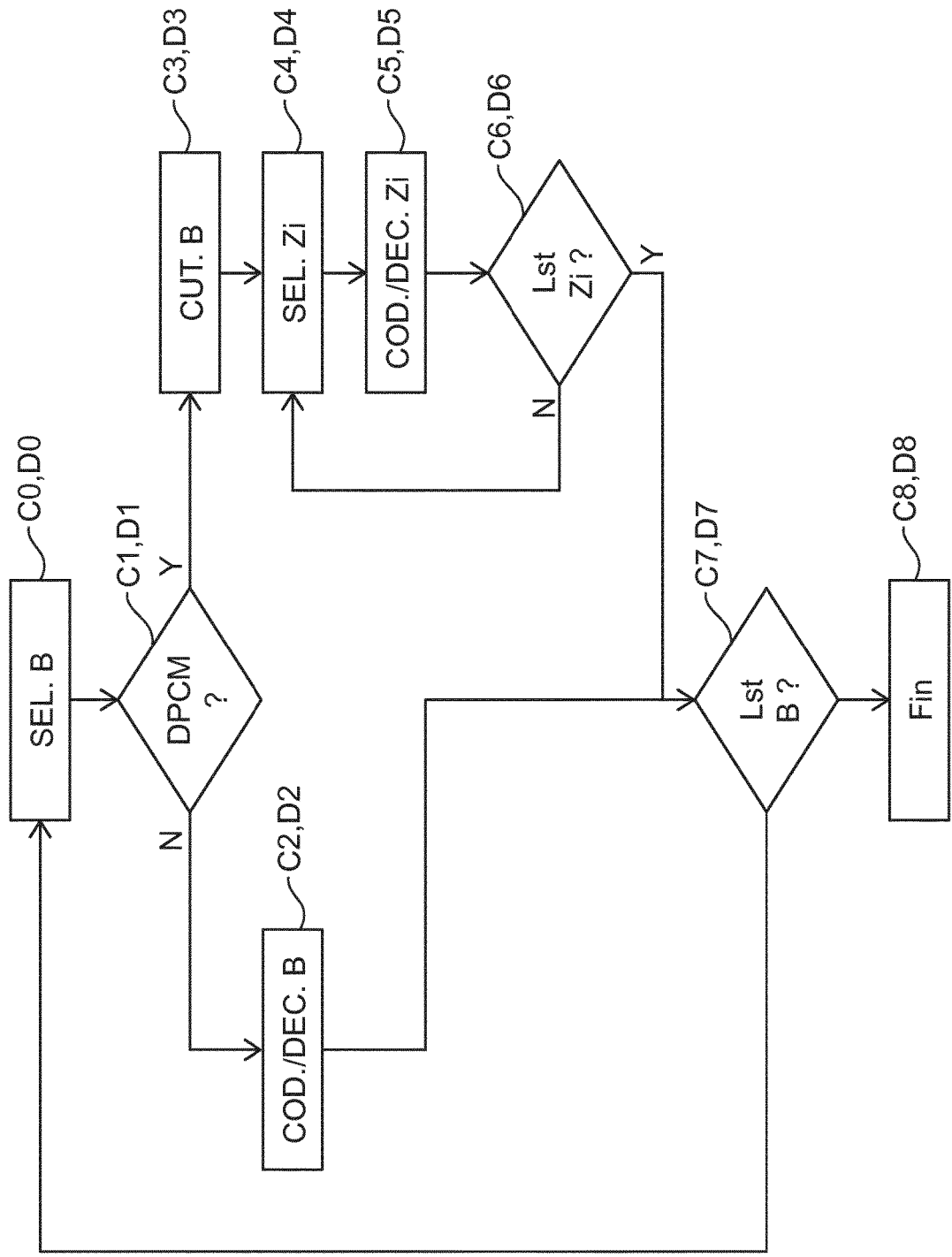
Figure 10:
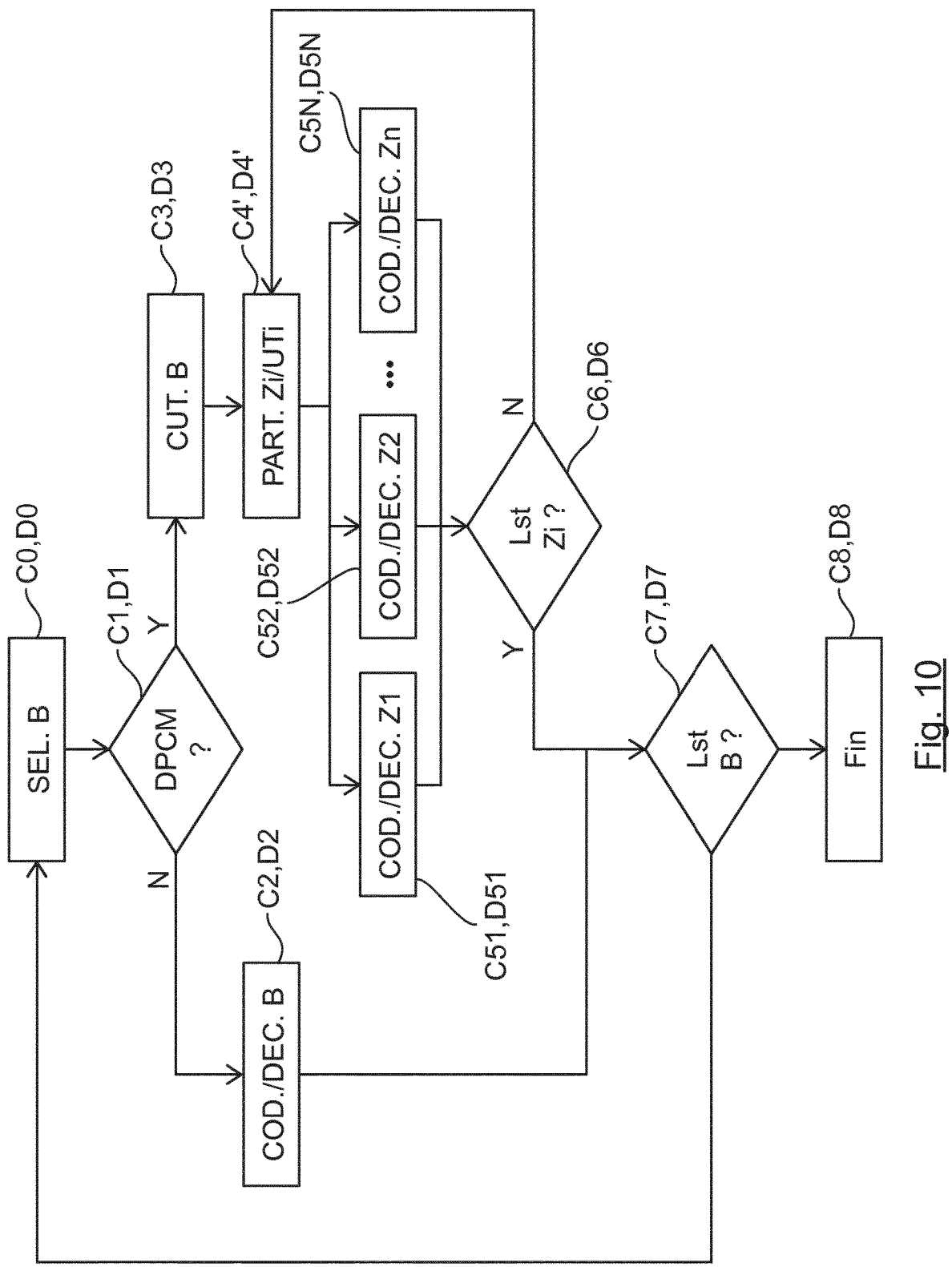
Figure 11:
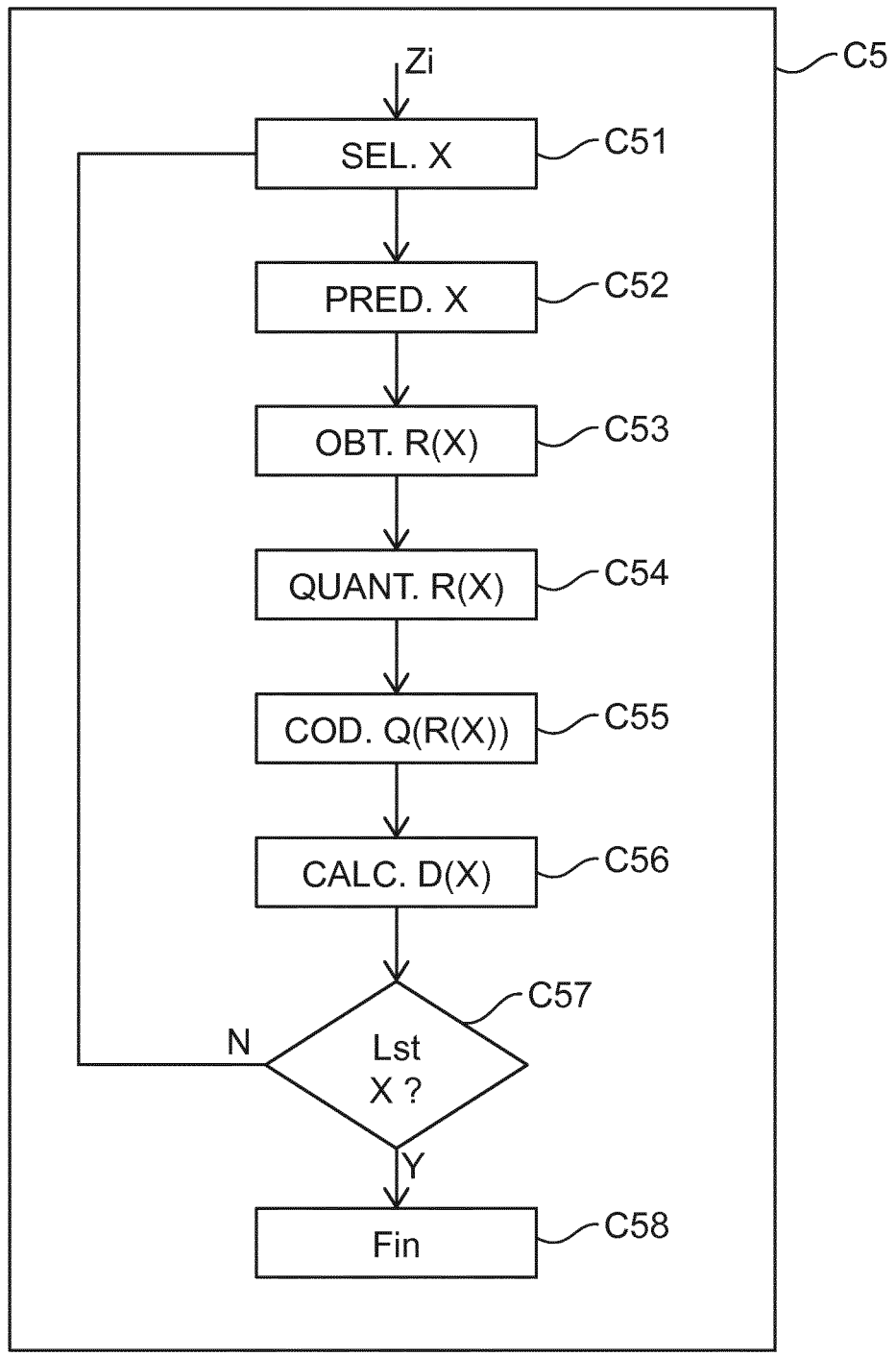
Figure 12:
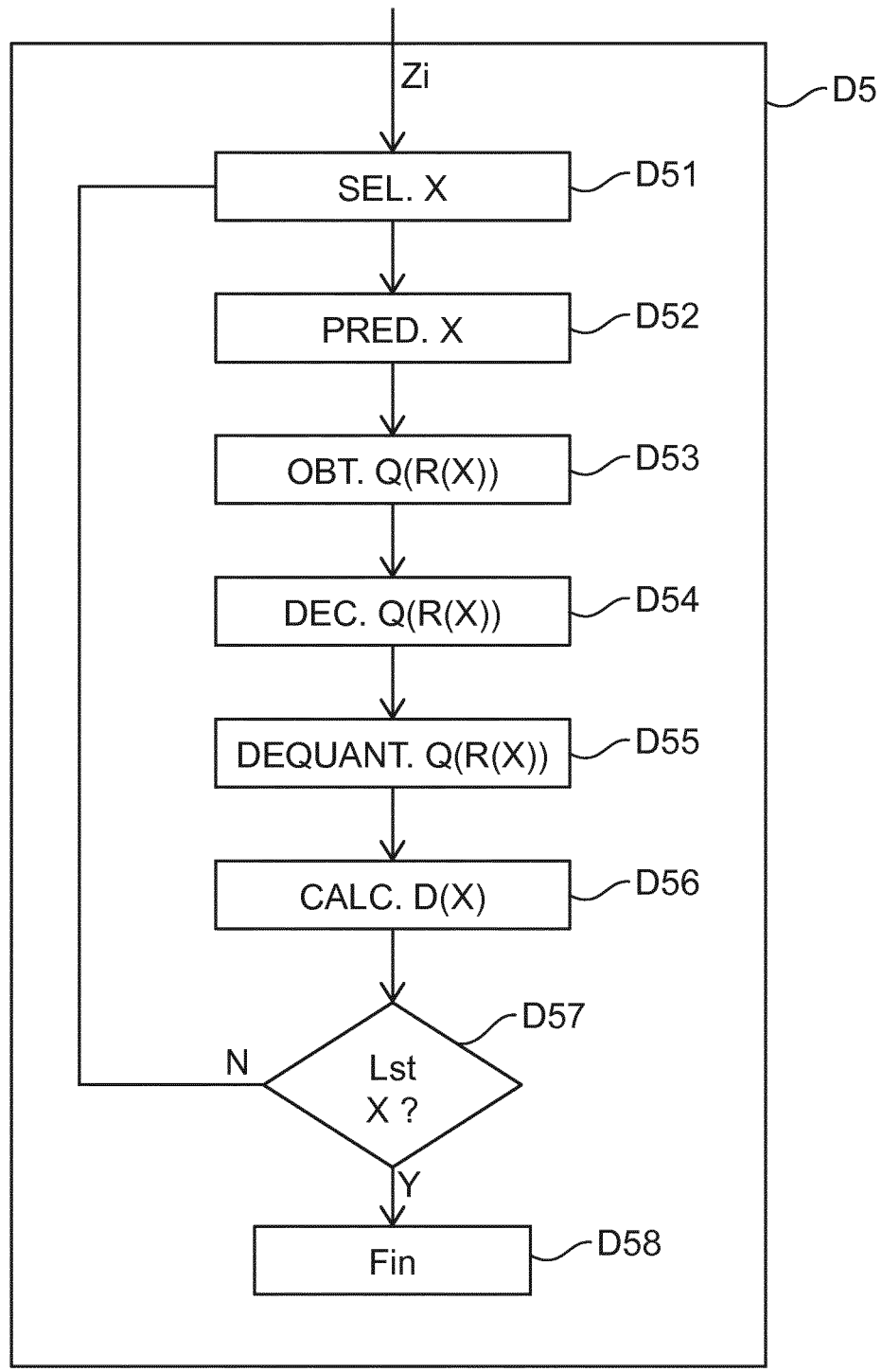
Figure 13:
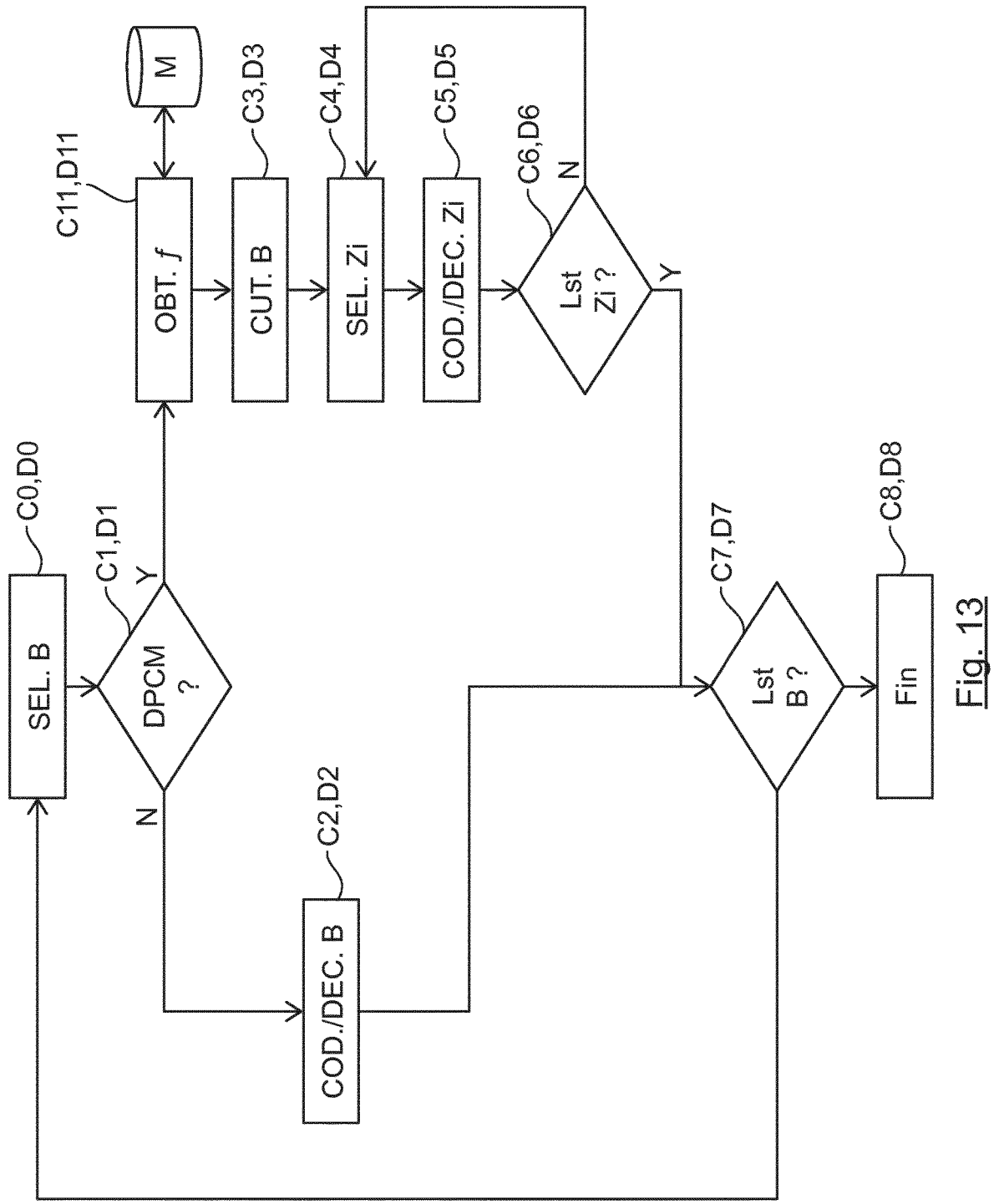
Figure 14:
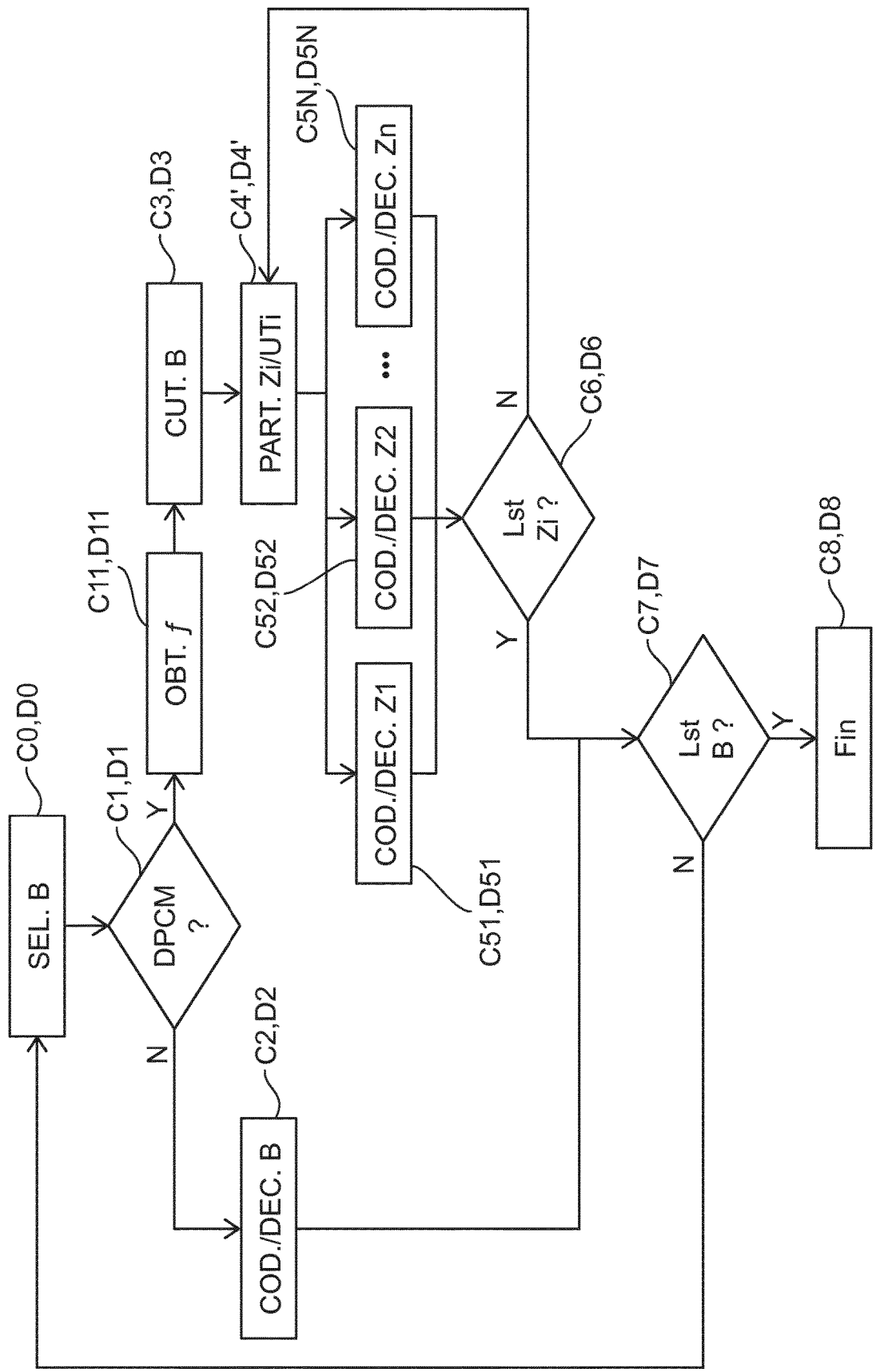
Figure 15:
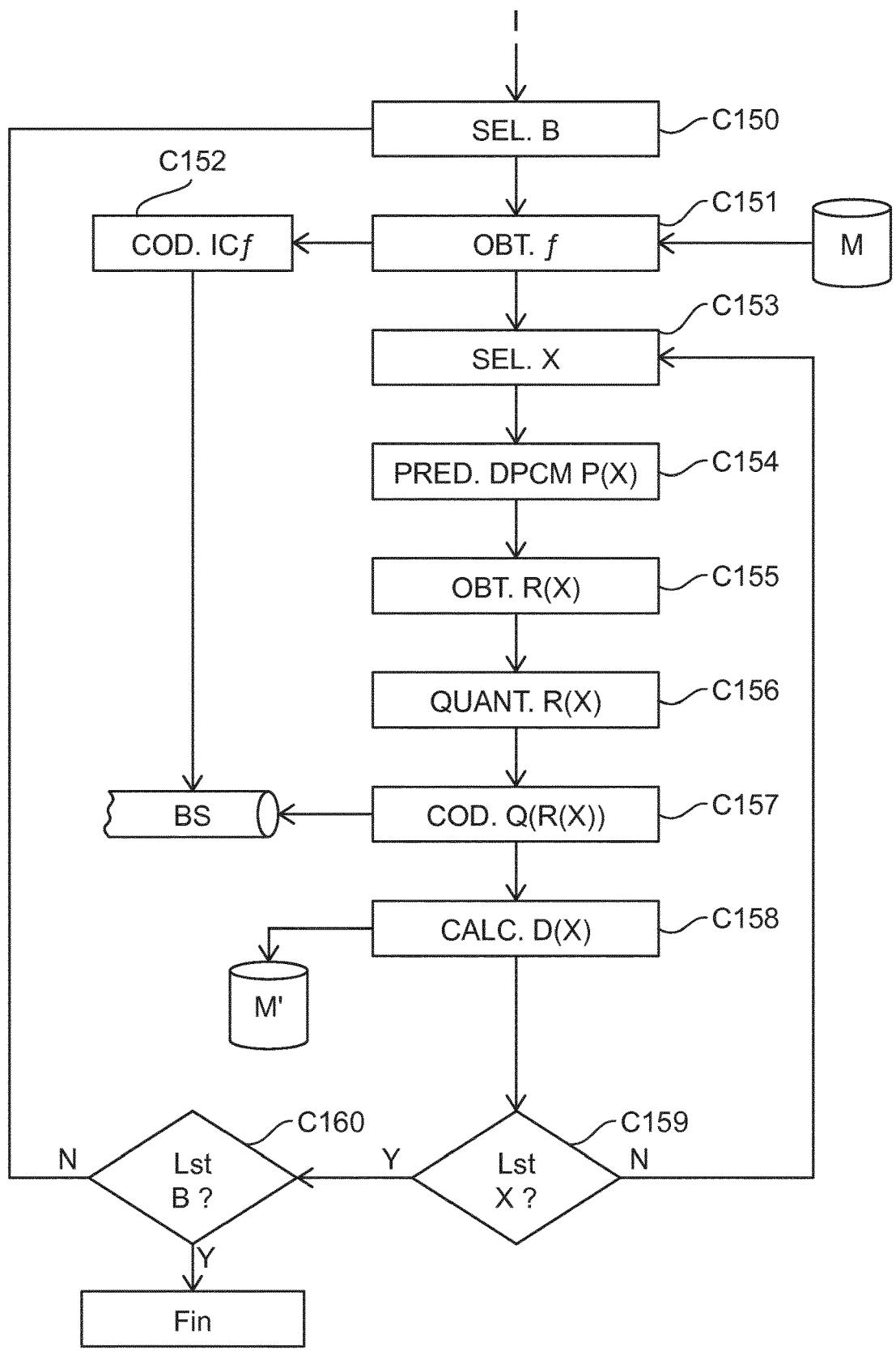
Figure 16:
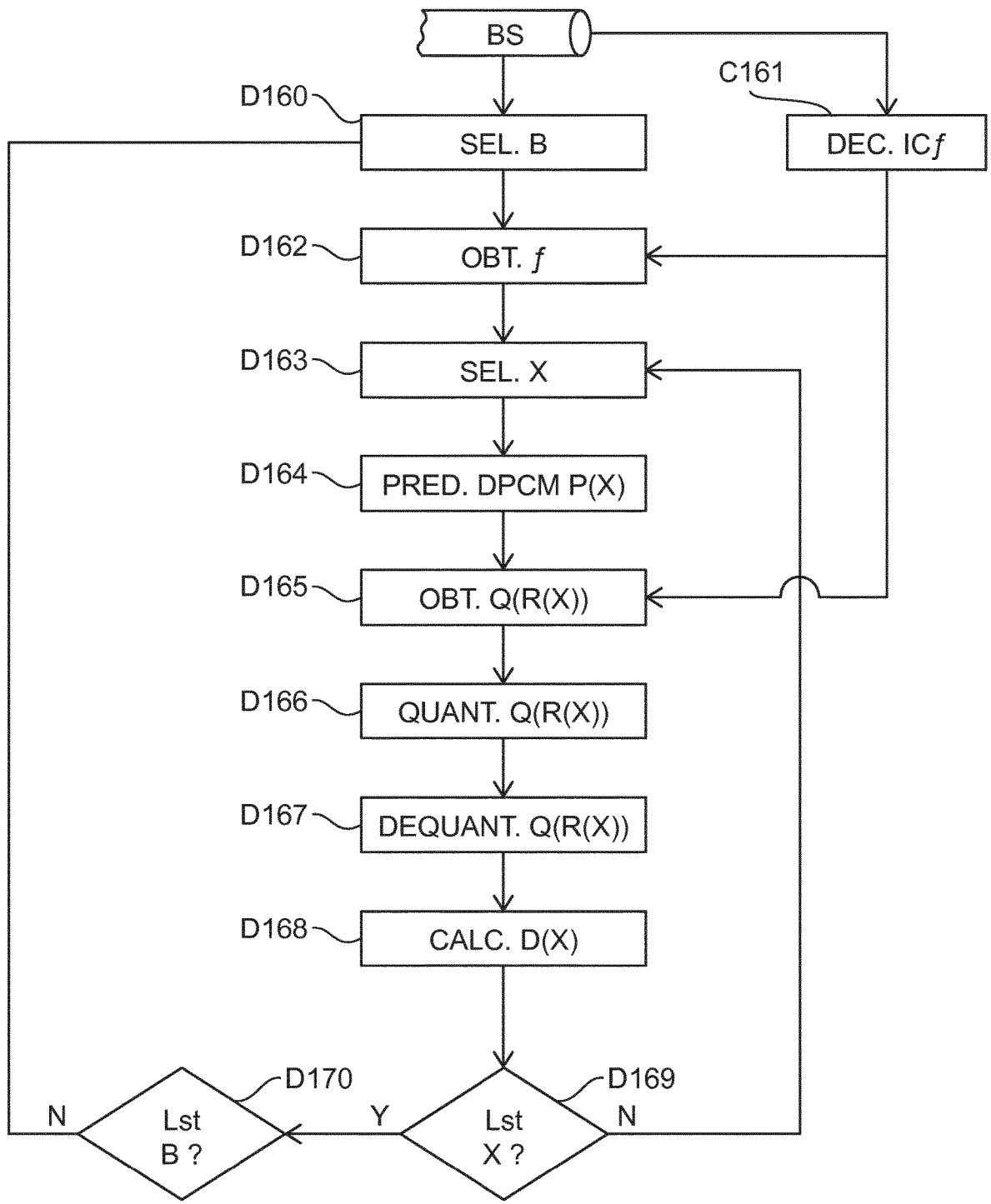
Figure 17A:
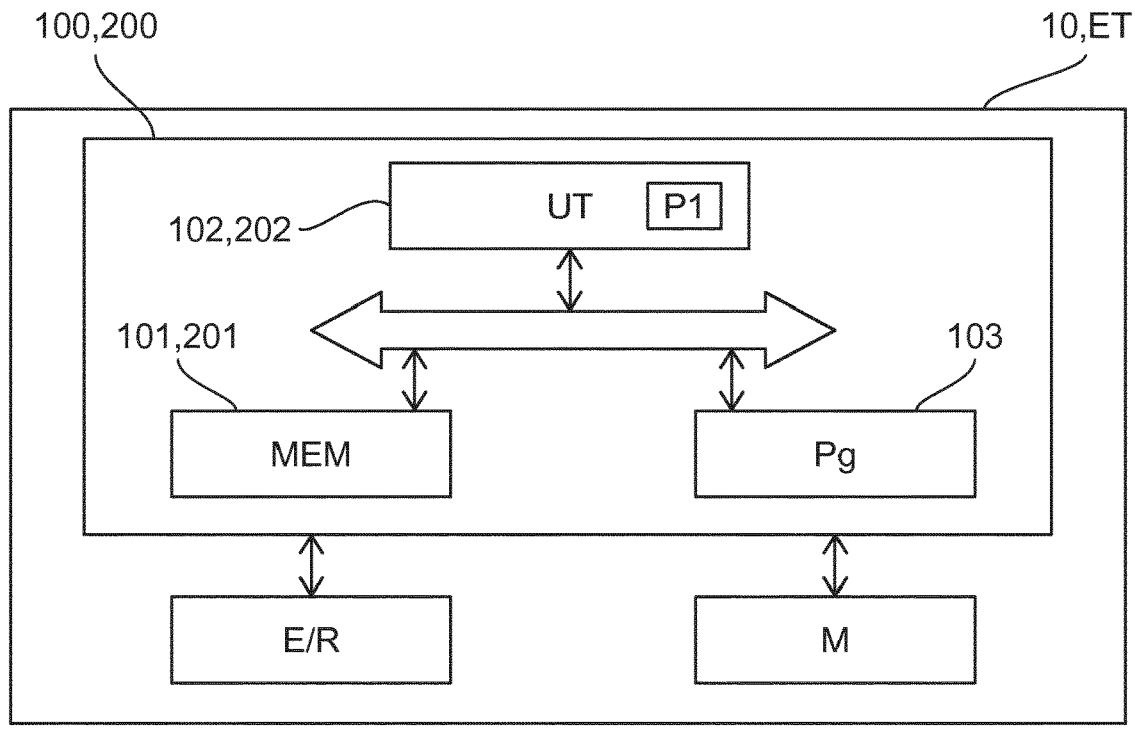
Figure 17B:
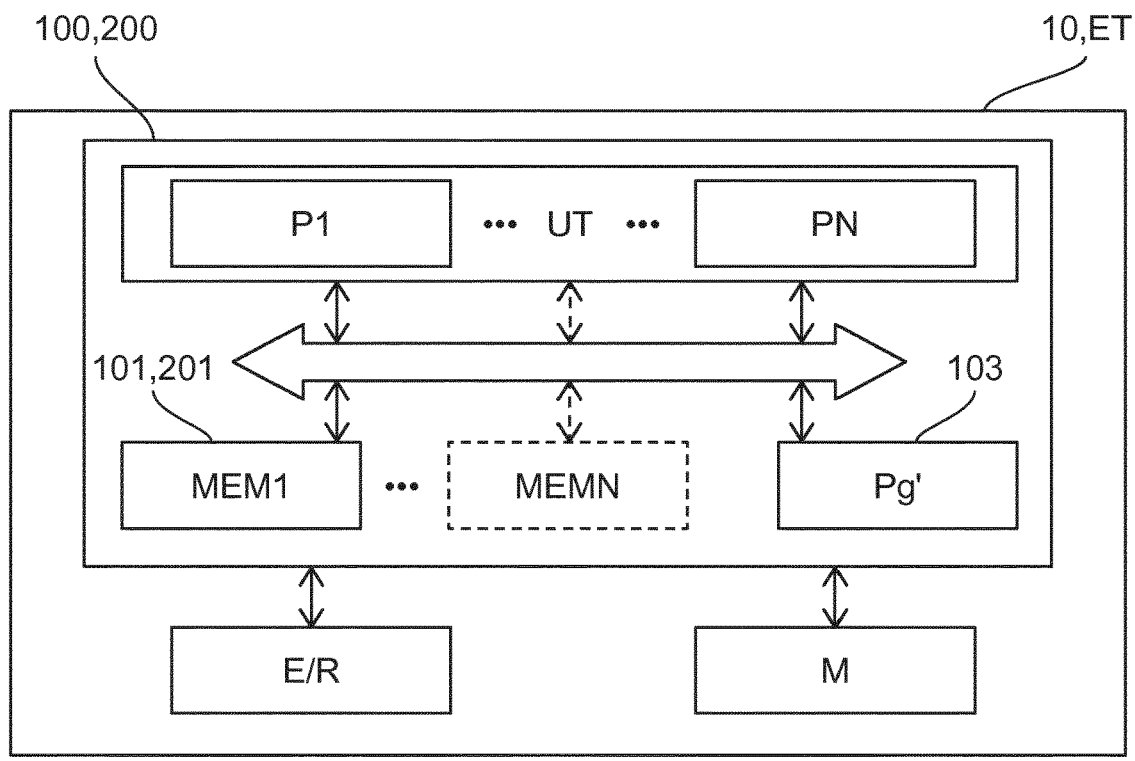
Figure 18:
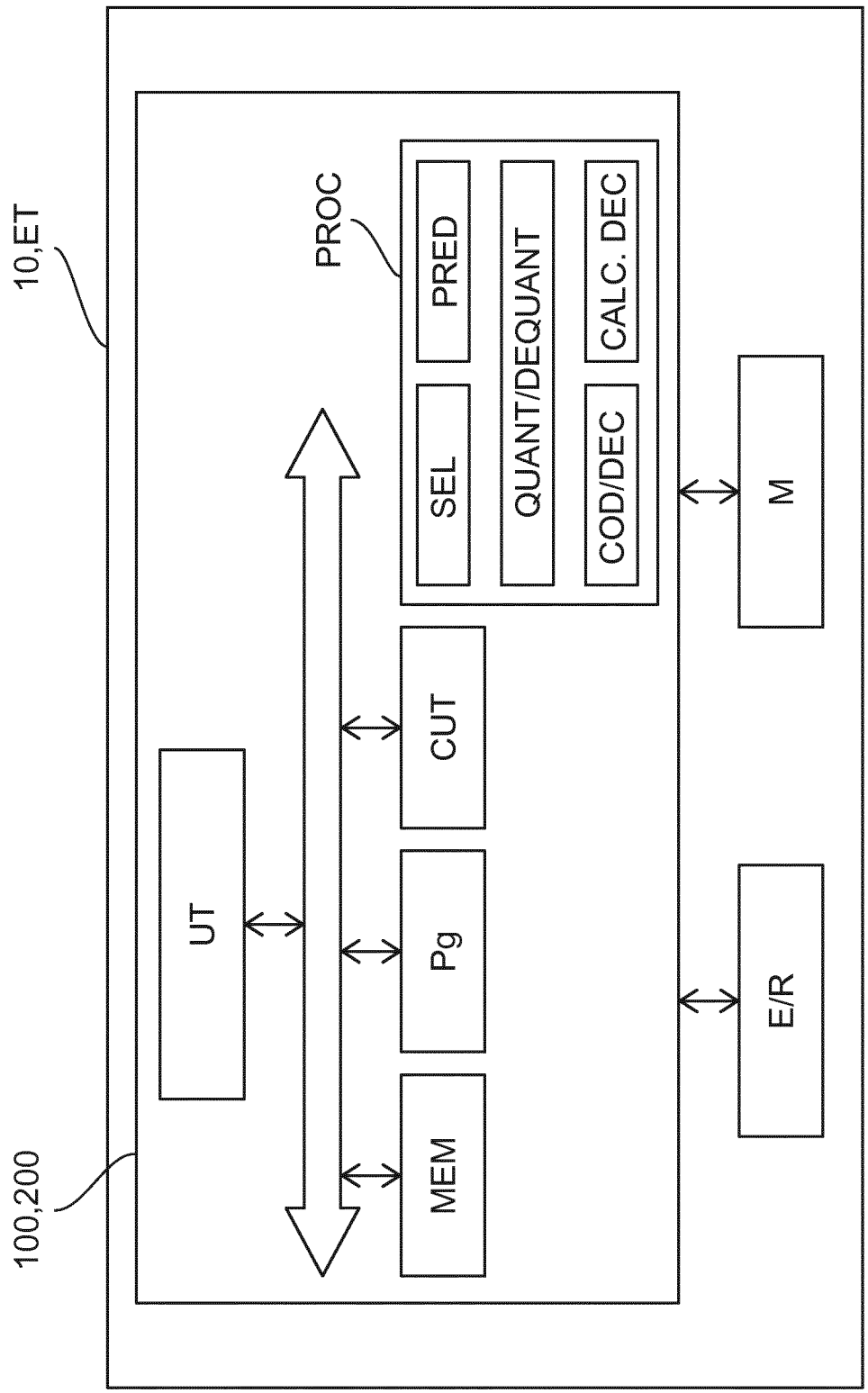

FIGS. 8A to 8G present a machine cycle number required for the processing of an element of a block or of an area of a block;

FIG. 9 describes the steps of an encoding or decoding method according to the invention in a serial mode;

FIG. 10 describes the steps of an encoding or decoding method according to the invention in a parallel mode;

FIG. 11 details the steps of encoding an area split in a block according to an embodiment of the invention;

FIG. 12 details the steps of decoding an area split in a block according to an embodiment of the invention;

FIG. 13 describes the steps of an encoding or decoding method in a serial mode according to a variant of the invention;

FIG. 14 describes the steps of an encoding or decoding method in a parallel mode according to a variant of the invention;

FIGS. 15 and 16 describe the steps of a method for encoding, respectively decoding, at least one image according to another embodiment of the invention;

FIGS. 17A, 17B and 18 schematically illustrate examples of a hardware structure of an encoding or decoding device adapted to implement the encoding or decoding method according to any one of the variants of the invention.

5. DETAILED DESCRIPTION OF EMBODIMENTS OF THE INVENTION

5.1 General Principle

The invention relates to the prediction of a block of an image to be encoded or decoded, in particular the prediction according to the previously described DPCM technique. According to this technique, the elements of a current block are predicted from other elements of this block.

The invention aims to improve this technique by allowing increasing the execution speed of the prediction of the block by an encoder or a decoder.

One principle of the invention is based on splitting a current block of an image to be encoded or decoded into several independently decodable areas. When a current element of one area requires an element located in another area to predict the current element, it uses a replacement value. For example, this value is predetermined and read in a memory, or it is determined by the encoder for the current block and read by the decoder in the encoded data representative of the current block or, still, the value of an element of a previously encoded or decoded block, preferably amongst the blocks the closest to the current block.

Firstly, embodiments of implementations of splitting of a block into several areas and of prediction of the obtained areas according to the invention, then an encoding method and a decoding method according to the invention using such a prediction by areas, are presented.

5.2 Splitting of the Current Block into Areas and Prediction of the Obtained Areas Variants of implementations for splitting a current block into areas and predicting the obtained areas independently of each other are presented hereinafter with reference to FIGS. 2 to 8.

Figure 2:
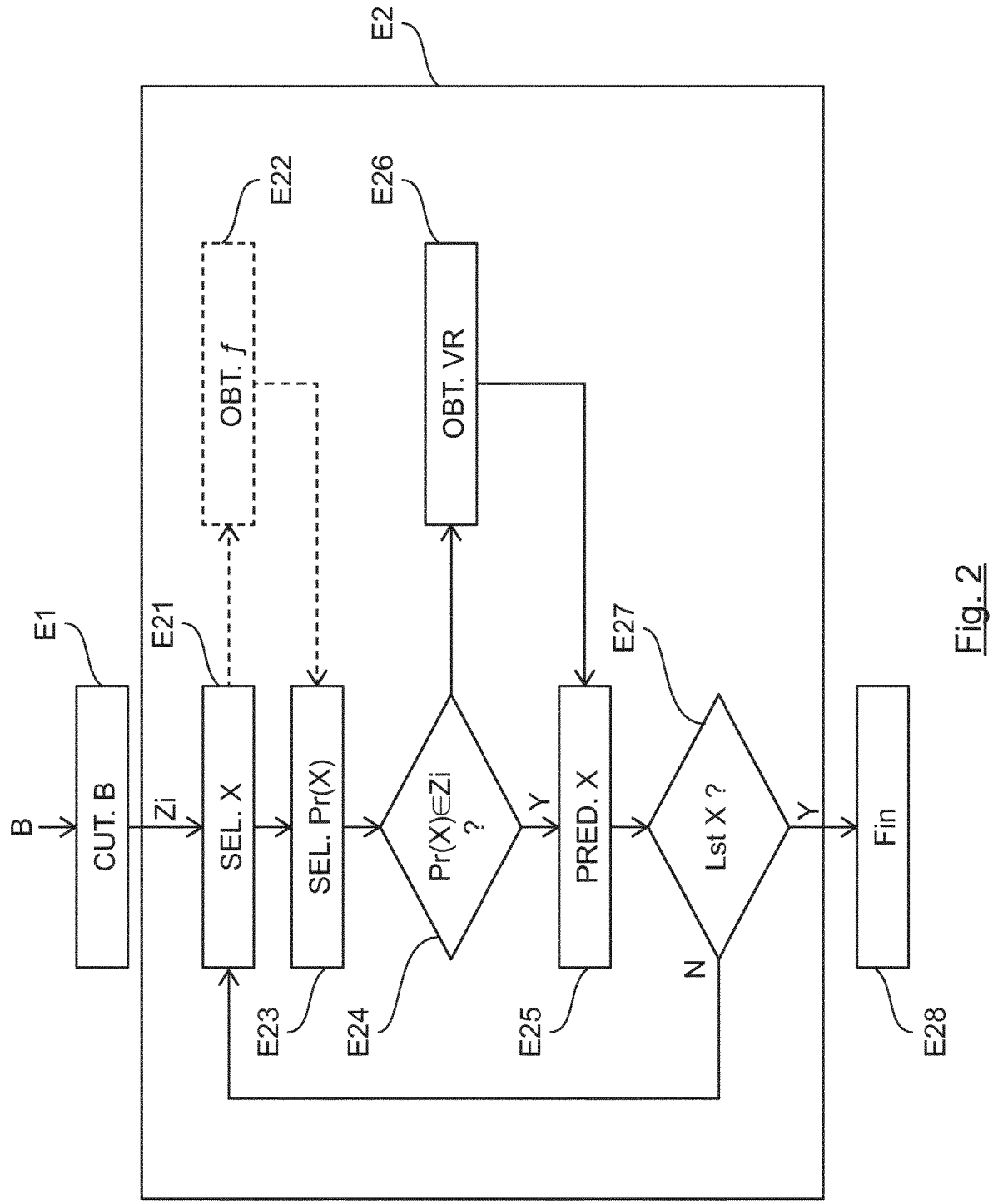

Referring to FIG. 2, there are described the steps implemented by a method for encoding or decoding a block B of an image to be encoded or decoded according to the invention.

At E1, the block B is split into several areas Z1, Z2 ... ZN with N an integer greater than or equal to 2. It should be noted that, according to the invention, the split or splitting mode applied at E1 to the block B is selected according to an encoding/decoding context, that is to say according to operating constraints of the encoder/decoder, such as for example an order in which the blocks and the elements in a block are scanned, or the mode for predicting the elements of the block, so as to guarantee that the predictor element(s) of an element of the block is/are available when this element is scanned. The splitting mode may be predetermined and known to the encoder and decoder or, according to an embodiment of the invention, be determined according to encoded information transmitted in the compressed stream or file. Variants will be described hereinafter.

Examples of splits will be presented hereinafter with reference to FIGS. 3A to 3F and 5A to 5C.

At E2, an area Zi, with i an integer comprised between 1 and N, is predicted as follows:

At E21, at least one element or pixel X in the area Zi is selected and the value of at least one component of this element is considered. For example, this consists of its luminance value Y in a YCbCr representation model of the color space, common in video processing. Of course, the invention is not limited to this example and applies to any component of another representation model of the color space.

In the following description, it is considered that the elements of the block B are scanned in the lexicographical order. Of course, the invention is not limited to this scanning order and applies to any other scanning order, such as for example the zigzag scanning known to those skilled in the art.

During an optional step E22, a prediction function f to be applied to the current block B is obtained.

For this element X, a predictor element is selected afterwards at E23 by applying the obtained prediction function f or a predetermined prediction function. This prediction function f predicts the value of the element X from at least one of the neighbouring elements already processed, that is to say encoded or decoded.

In the following description, by neighbouring element, it should be understood, in broad terms, an element of the block B that is close to the current element, without being necessarily adjacent thereto.

The example of the so-called JPEG-LS or f(A, B, C) prediction function, which predicts the value of the current element X from that one of its left A, right B and diagonal top-left C neighbours, has been described with reference to FIG. 1.

Other examples of prediction functions are indicated:
f(A,B,C)=XA
f(A,B,C)=XB
f(A,B,C)=XA+XB−XC
f(A,B,C)=0.33XA+0.33X+0.34XC Some of these examples will be described hereinafter with reference to FIGS. 3A to 3F. Hence, such a prediction function can use one or several predictor element(s).

At E24, for each of the predictor elements designated by the used prediction function f, we check whether it belongs to the current area Zi.

If this is the case, the prediction function is applied at E25 to obtain the predicted value P(X) of the current element X from the values of the predictor element(s).

Otherwise, at E26, a replacement value VR is obtained for the predictor element that falls outside the current area Zi. Several variants of implementation may be considered, among which mention may exhaustively be made of:

- read in a memory a predetermined value, for example equal to the average of the dynamics of possible values for the element X. In the case where the element X could take on its luminance value within the range [0,255], then the replacement value VR is set to 128;
- obtain a replacement value that is specific to the current block B, such as for example the average value of the intensities of the elements of the block. In this case, this value is calculated on the encoder side, encoded and transmitted in the encoded data to the decoder, which obtains it by reading the encoded data;
- replace the predictor element with another predictor element located in a previously encoded or decoded neighbouring bock. Example of implementation of this option will be described hereinafter with reference to FIGS. 3B, 3E and 6A to 6D.

Once the replacement value is obtained for each of the predictor elements located outside the current area Zi, the value P(X) of the current element X is predicted at E25.

At E27, we check whether there are still elements of the block to be predicted. If so, we return back to step E21 of selecting at least one element X. Otherwise, the processing ends at E28.

5.2.1 First Example of Implementation: Vertical Prediction

Figure 3A:
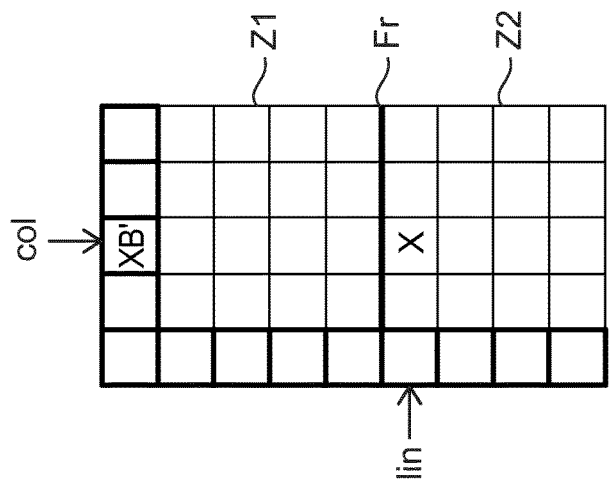
FIGS. 3A to 3C illustrate examples of splitting and predicting an element of a block using a vertical prediction function according to an embodiment of the invention.
Figure 3F:
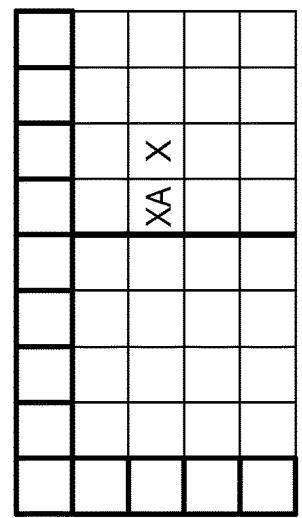
FIGS. 3D to 3F illustrate examples of splitting and predicting an element of a block using a horizontal prediction function according to another embodiment of the invention.
Figure 3B:
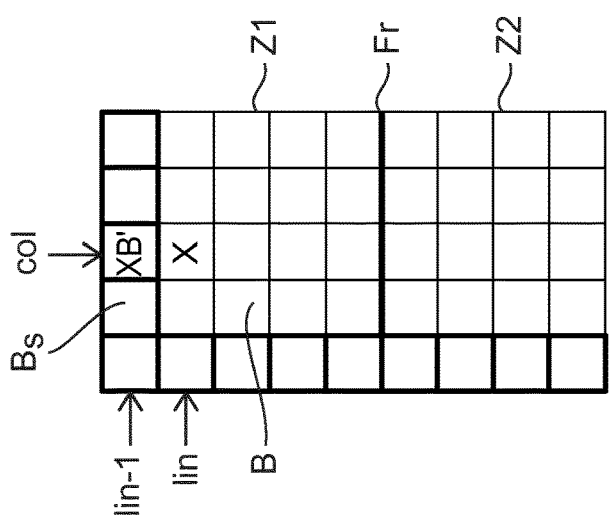
Figure 3E:
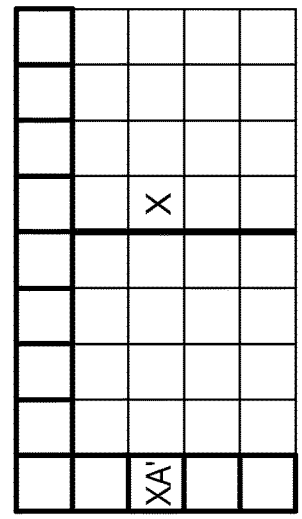
Figure 3C:
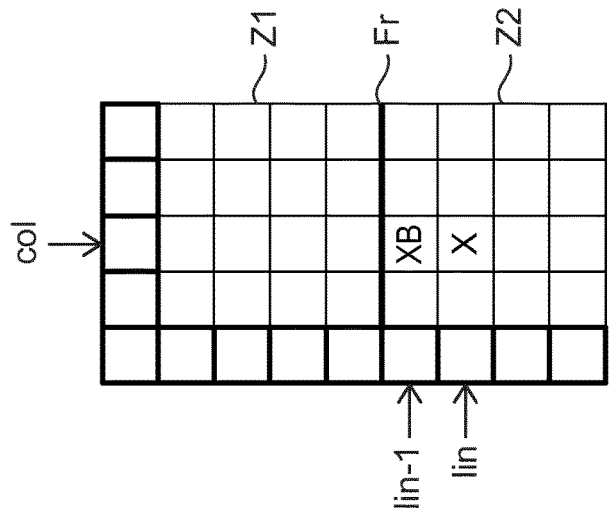

Referring to FIGS. 3A to 3C, consider now a first example of implementation of the invention which uses a prediction function, called vertical prediction. This function makes use of only one single predictor element, namely the element B located directly above the current element X. When considering that the element X or X(lin,col) is located on the row lin and the column col, the predictor element B is located on the row lin−1 and on the same column col. In FIGS. 3A to 3C, there is represented as example a block B with a height H=8 elements and with a width W=4 and the block B is split into two areas with the same dimensions Z1 and Z2, that is to say with a height W/2=4 and with a width W=4. The area Z1 is located above the area Z2 and they are separated by a boundary Fr which is in the form of a horizontal line segment. In mathematical terms, the area 1 comprises all of the elements of the block B located above the boundary Fr which have a row number lin that meets the relationship lin<5. In turn, the area Z2 comprises all of the elements located below this horizontal line, that is to say whose row number meets the relationship lin≥5.

First, consider the area Z1. As regards the elements of the first row lin=1 from the top-left corner of the block B, as illustrated in FIG. 3B, the vertical prediction function designates a predictor element B' that does not belong to Z1, but to the last row of the block located above the block B.

In this case, step E25 is done according to one of the previously listed options to obtain a replacement value. In particular, it may use, in a known manner, the value of the element XB' of the previous block pointed by the vertical prediction function. Indeed, this block having already been processed, the decoded value of the element XB' is available.

For the other rows, the vertical prediction designates predictor elements belonging to 21. Hence, the prediction of the elements of the area Z1 is done according to the conventional DPCM technique.

Consider now the second area Z2. As illustrated in FIG. 3C, the elements of its first row make use of vertical predictors located in the first area Z1. Yet, the invention prevents the use of these predictor elements so as to guarantee processing independence between the two areas.

In this case, step E25 is done according to one of the previously listed options to obtain a replacement value. In particular, the invention suggests looking for a predictor element in the neighbouring block $B_S$ located above the current block. Advantageously, the predictor element selected to replace the element XB is the element XB" (lin=4, col) located on the same column as the current element X and the closest to the current block, on the row lin=4 which adjoins the boundary Fr between the two areas Z1 and Z2. Of course, the invention is not limited to this example. Any other element of a neighbouring block that is already processed may be used to replace the forbidden predictor element, even though the selection of a predictor element that is the closest and located according to the same direction is more likely to provide a good quality prediction.

As regards the elements of the next rows of the area 2, step E22 designates predictor elements that belong to Z2. Hence, the prediction is done at E24 in a conventional manner.

Figures 4A, 4B, 4C, 4D:
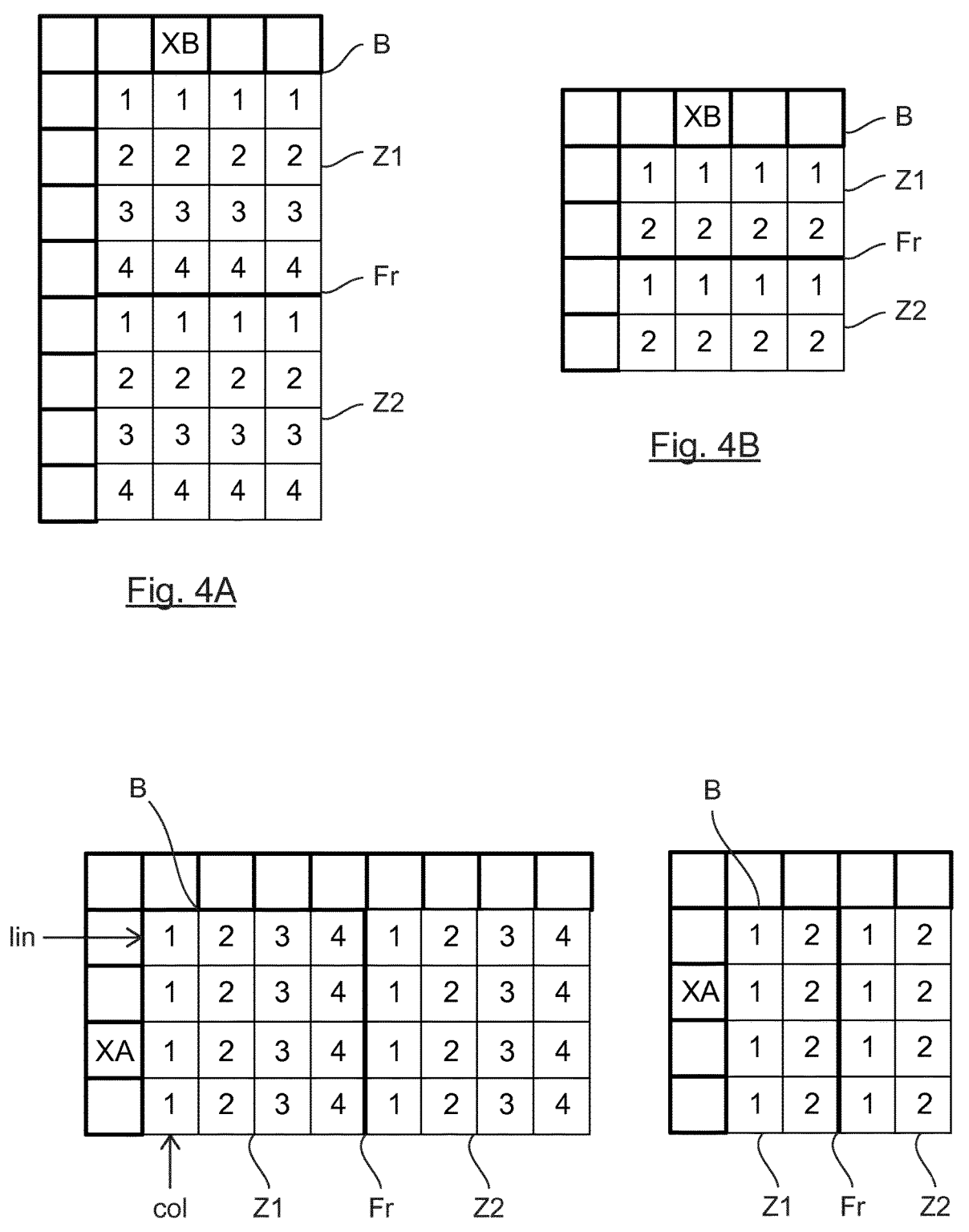

By preventing every dependence in prediction between the two areas Z1 and Z2, the invention allows for a parallelisation of processing thereof. Referring to FIG. 4A, an order for processing the elements of the current block B is assigned for a lexicographic scanning order, when the prediction implements the vertical prediction function. Furthermore, there is shown that, for each of the two areas Z1 and Z2, the elements of the first row may be predicted during a first processing time or first iteration, the element of the second row during a second iteration, etc. In this manner, for a block with the dimensions H=8 and W=4, 4 iterations, or said otherwise 4 machine cycles, are therefore enough to predict the entirety of the block, instead of 8 for the entire block, without the implementation of the invention.

Referring to FIG. 4B, another example of implementation of the invention is presented, with a 4×4 block split into two areas Z1 and Z2 with equal dimensions, separated by a horizontal boundary Fr. 4 machine cycles are necessary to process the entire block, while each area requires 2 machine cycles.

5.2.2 Second Example of Implementation: Horizontal Prediction

Figure 3D:
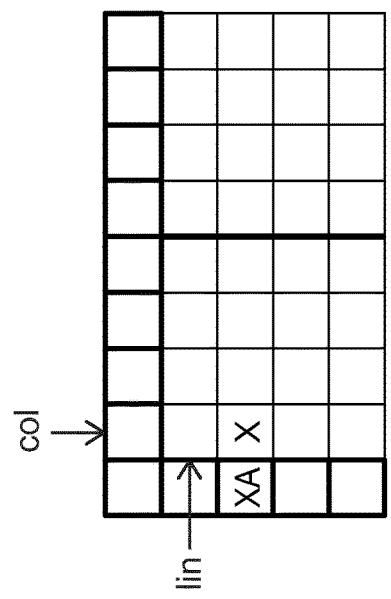

Referring to FIGS. 3D to 3F, consider now a second example of implementation of the invention which uses a prediction function, called horizontal prediction. This function makes use of only one single predictor element, namely the element XA located directly to the left of the current element X, on the same row.

When considering that the element X or X(lin,col) is located on the row lin and the column col, the predictor element XA is located on the row lin and on the column col−1.

In FIGS. 3D to 3F, there is represented as example a block B with a height H=4 elements and with a width W=8 and the block B is split into two areas with the same dimensions Z1 and Z2, each having a height H=4 and a width W/2=4. The area Z1 is located next to the area Z2 and they are separated by a boundary Fr which is in the form of a vertical line segment. In mathematical terms, the area 1 comprises all of the elements of the block B located to the left of the boundary Fr which have a row number col that meets the relationship col<5. In turn, the area Z2 comprises all of the elements located to the right of this diagonal, that is to say whose row number meets the relationship col≥5.

First, consider the area Z1. As regards the elements of the first row col=1 from the top-left corner of the block B, as illustrated in FIG. 3D, the horizontal prediction function designates a predictor element $X_A$ that does not belong to Z1, but to the last column of the block located to the left of the block B.

In this case, step E25 is done according to one of the previously listed options to obtain a replacement value. In particular, it may use, in a known manner, this value of the element $X_A$ of the previous block pointed by the horizontal prediction function. Indeed, this block having already been processed, the decoded value of the element $X_A$ is available.

For the next columns of the block B, starting from col=2, the horizontal prediction designates predictor elements belonging to 21. Hence, the prediction of the elements of the area Z1 is done according to the conventional DPCM technique.

Consider now the second area Z2. As illustrated in FIG. 3E, the elements of its first column make use of horizontal predictors located in the first area Z1. Yet, the invention prevents the use of these predictor elements so as to guarantee processing independence between the two areas.

In this case, step E25 is done according to one of the previously listed options to obtain a replacement value. In particular, the invention suggests looking for a predictor element in the neighbouring block $B_G$ located to the left of the current block. Advantageously, the predictor element selected to replace the element XA is the element XA' (lin,col=4) located on the same row as the current element X and in the rightmost column, col=4 of the block $B_G$, which adjoins the boundary Fr between the two areas Z1 and Z2.

Of course, the invention is not limited to this example. Any other element of a neighbouring block that is already processed may be used to replace the forbidden predictor element, even though the selection of a predictor element that is the closest and located according to the same direction is more likely to provide a good quality prediction.

As regards the elements of the next rows of the area 2, step E22 designates predictor elements that belong to Z2. Hence, the prediction is done at E24 in a conventional manner.

By preventing every dependence in prediction between the two areas Z1 and Z2, the invention allows for a parallelisation of processing thereof. Referring to FIG. 4C, an order for processing the elements of the current block B is assigned for a lexicographic scanning order, when the prediction implements the horizontal prediction function. There is shown that, for each of the two areas Z1 and Z2, the elements of the first row may be predicted during a first processing time or first iteration, the element of the second row during a second iteration, etc. In this manner, for a block with the dimensions H=4 and W=8, 4 iterations, or said otherwise 4 machine cycles, are therefore enough to predict the entirety of the block, instead of 8 for the entire block, without the implementation of the invention.

Referring to FIG. 4D, another example of implementation of the invention is presented, with a 4×4 block split into two areas Z1 and Z2 with equal dimensions, separated by a vertical boundary Fr. 4 machine cycles are necessary to process the entire block, while each area requires 2 machine cycles.

5.2.3 Third Example of Implementation: JPEG-LS Prediction

Figure 1B:
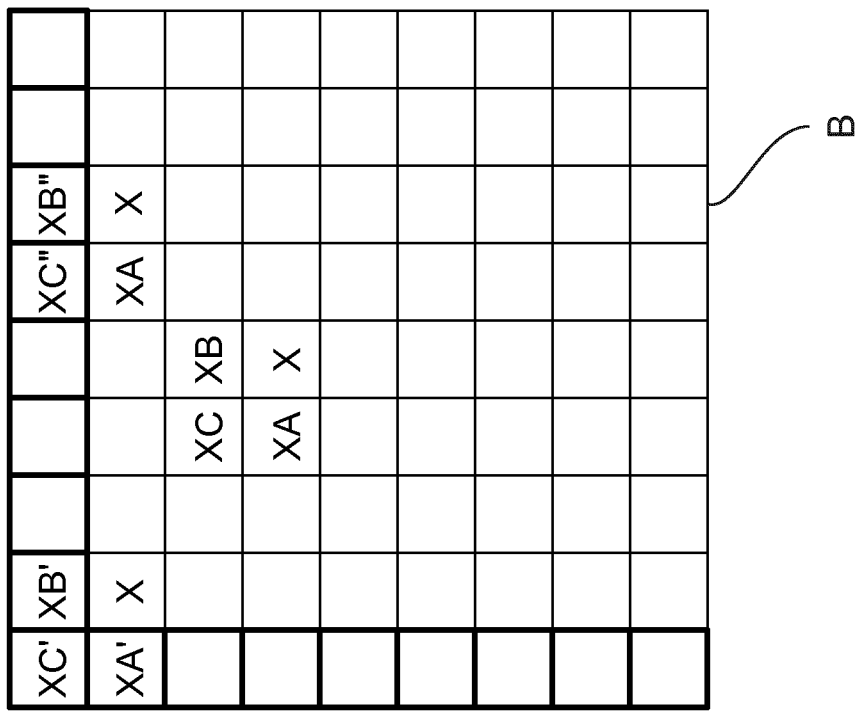
Figure 1A:
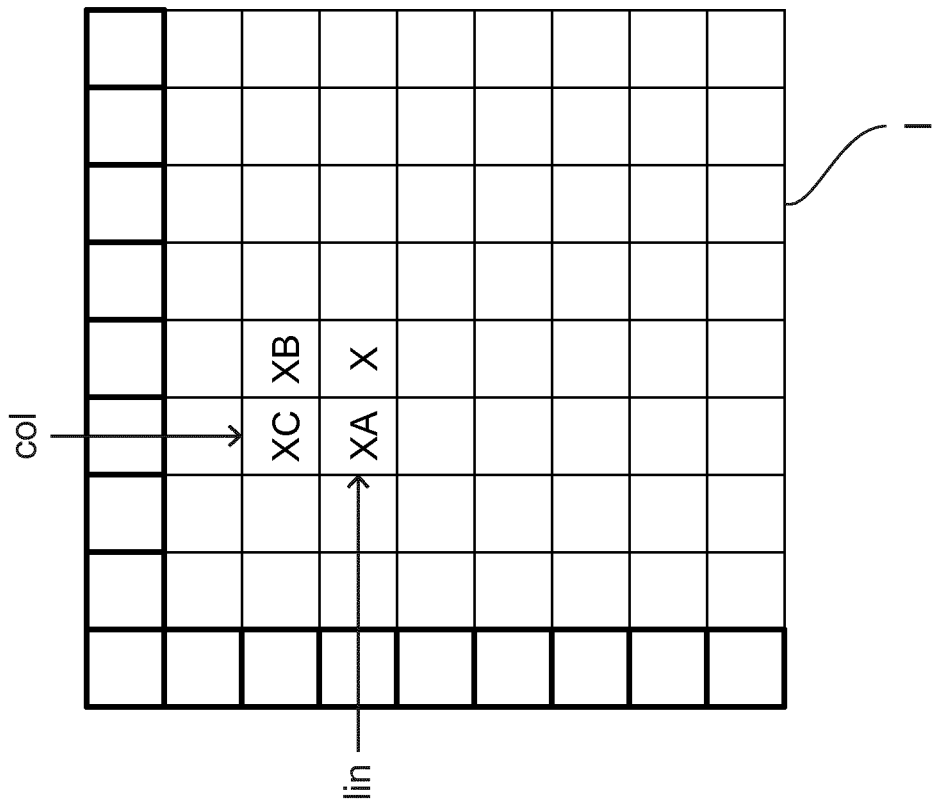

Consider now the so-called JPEG-LS prediction function already described with reference to FIGS. 1A and 1B and a block B with a height H=8 and a width W=8. According to the example of implementation of the invention illustrated by FIG. 5A, the block B is split into two areas Z1 and Z2 separated by a diagonal boundary Fr. Let's call X(lin,col) the pixel located on the row lin and the column col numbered starting from zero. In mathematical terms, the area Z1 comprises all of the elements of the block B located above the diagonal Fr which correspond to the elements whose coordinates meet the inequality lin+col<5. The area Z2 comprises all of the elements located below this diagonal boundary, which correspond to the elements for which lin+col≥5.

The elements of the area Z1 are predicted in a conventional manner. If a predictor element $X_A$, $X_B$ or $X_C$ designated by the JPEG-LS prediction function for the current element X falls within a preciously processed neighbouring block, its value is used for the prediction of the element X.

Figure 6A:
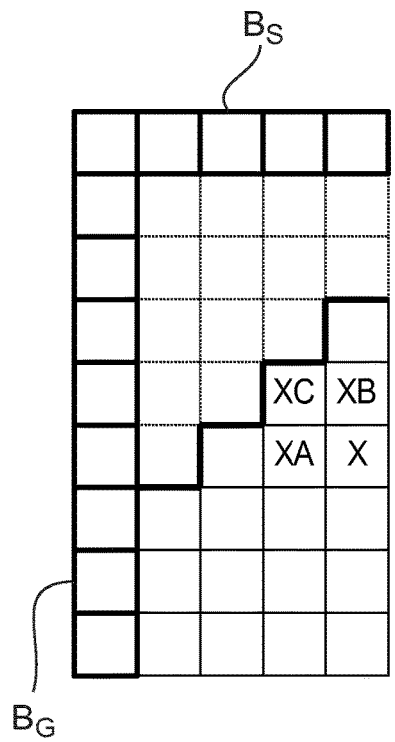
FIGS. 6A to 6E illustrate different examples of replacement values used to predict the diagonal areas of FIGS. 5A to 5C with the JPEG-LS prediction function.
Figure 6B:
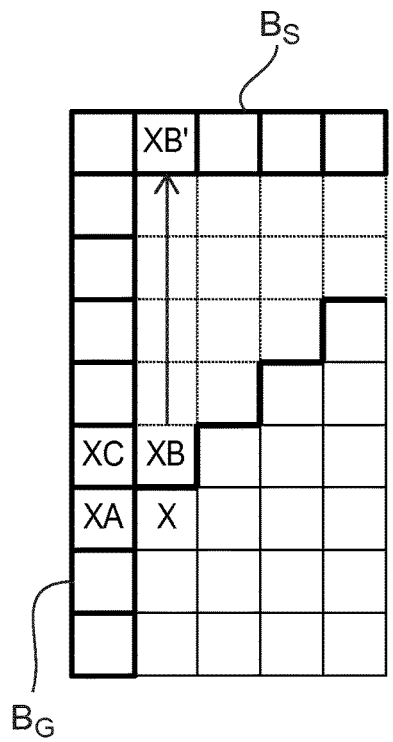
Figure 6C:
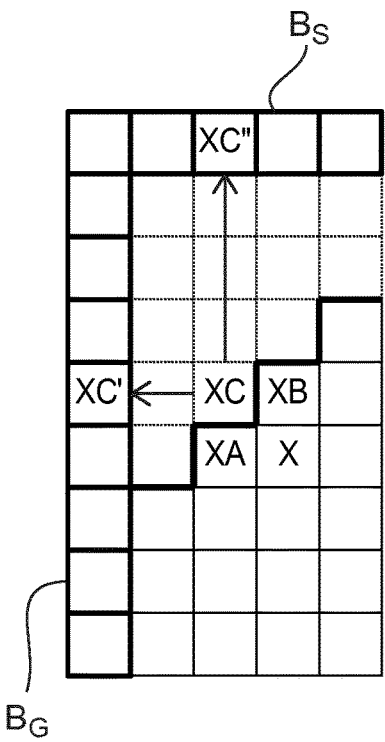
Figure 6D:
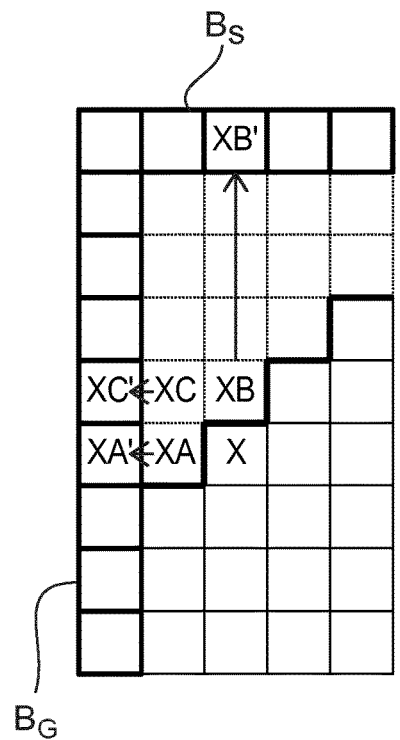
Figure 6E:
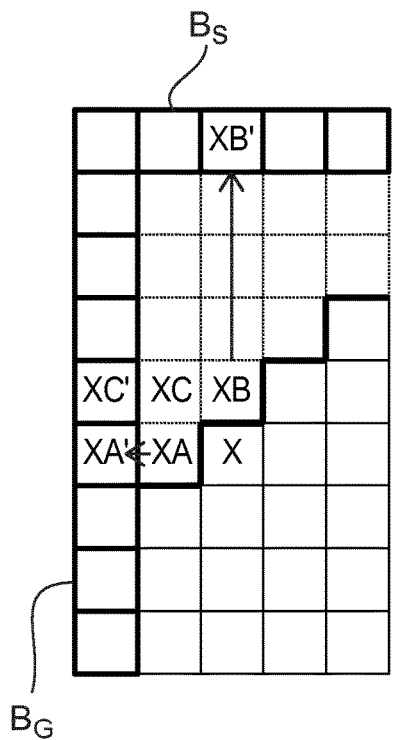

Consider now the area Z2. As illustrated in FIGS. 6A to 6E, the elements that adjoin the boundary Fr make use of predictors located in the first area Z1. Yet, the invention prevents the use of these predictor elements so as to guarantee processing independence between the two areas. In this case, step E25 is done according to one of the previously listed options to obtain a replacement value. In particular, the invention suggests looking for a predictor element $X_{A'}$ in the neighbouring block $B_G$ located to the left of the current block on the same row. Advantageously, the predictor element selected to replace the element $X_A$ is the element $X_{A'}$ located on the same row as the current element X and in the rightmost column col=4 of the block $B_G$ and a predictor element $X_{B'}$ in the upper neighbouring block $B_S$ in the same column as X and on the row lin=8 the closest to B. When the predictor element $X_C$ falls within the area Z1, as illustrated by FIGS. 6C and 6D, a replacement predictor element may for example be $X_{C'}$ on the same row as the predictor element designated by the prediction function in the left-side neighbouring block $B_G$, or $X_{C'}$ in the upper neighbouring block $B_S$ according to the same column.

Of course, the invention is not limited to this example. Any other element of a neighbouring block that is already processed may be used to replace the forbidden predictor element, even though the selection of a predictor element that is the closest and located according to the same direction is more likely to provide a good quality prediction.

However, the pixels of the area Z2 that have no predictor elements outside the area are predicted in a conventional manner.

Referring to FIG. 5B, we see that in this case it becomes possible to process the areas Z1 and Z2 in parallel, and, inside each area, it is still possible to process all of the elements of the same diagonal during the same iteration. For a 4×8 block that would require 11 machine cycles, the invention allows doing with only 6. Similarly, as illustrated by FIG. 5C, for a 4×4 block that would require 7 machine cycles, the invention allows doing with only 4.

5.2.4 Splitting of the Current Block into N Areas, with N an Integer Greater than 2

It is also possible to split a block into more than two independently decodable areas, for example into 4 areas Z1 to Z4 as illustrated by FIG. 7A for the vertical prediction and FIG. 7B for the JPEG-LS prediction. Provided that the encoder or the decoder has a sufficient number of processors, the number of cycles required for processing a block B is reduced even further. In the presented examples, the areas have either the same dimensions, or dimensions in the same order of magnitude, which allows reducing the number of required cycles even further.

5.2.5 Dimensions of the Blocks to be Predicted

Typically, a technique for encoding an image or an images sequence by blocks splits an image into blocks with variable sizes. For example, the available block dimensions are 4×4, 4×8, 8×4, 8×8 and 16×16.

Figure 8A:
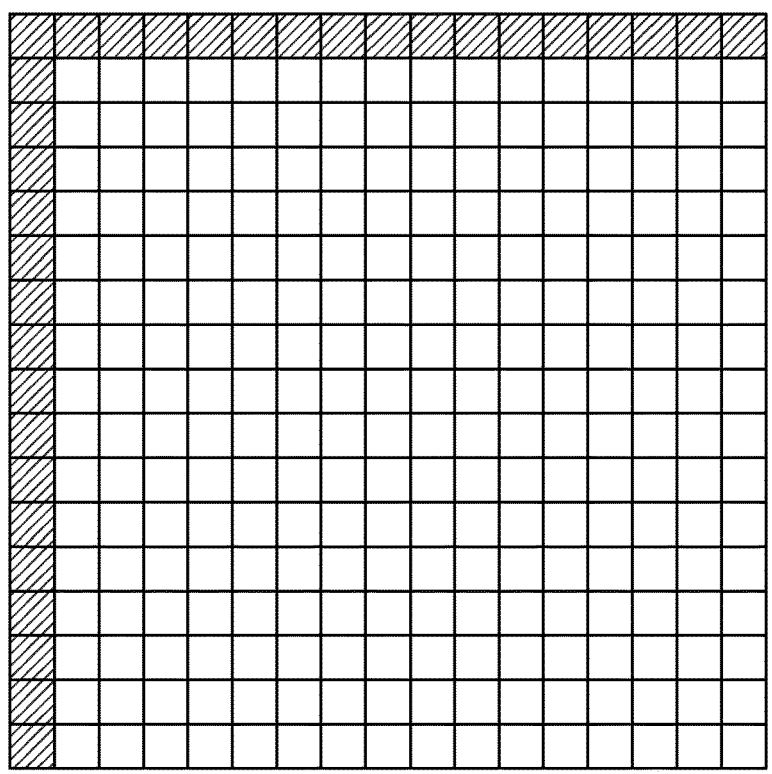
Figure 8B:
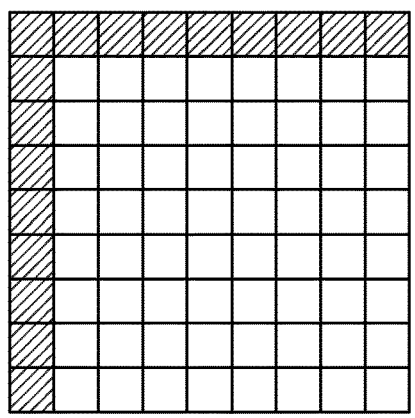
Figure 8C:
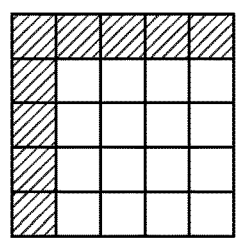
Figure 8D:
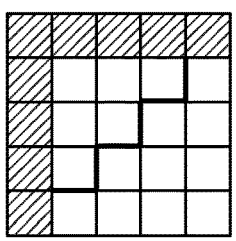
Figure 8G:
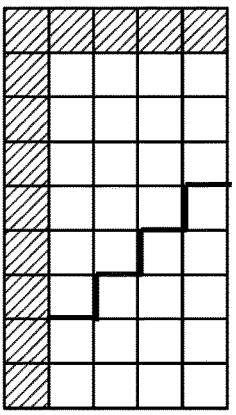
Figure 8E:
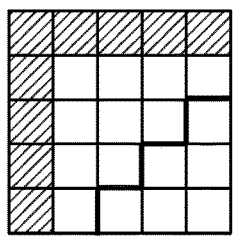
Figure 8F:
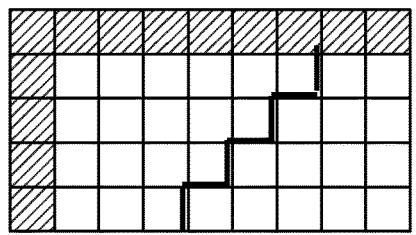

The blocks splitting that induces the largest number of machine cycles required for processing an image, is a splitting into small-sized blocks. Indeed, as illustrated by FIGS. 8A to 8C, a 16×16 block requires 0.12 machine cycle per element or 31 cycles for the block, a 8×8 block 0.23 cycle per element and a 4×4 block 0.44 cycle per element.

Consider again the example of the JPEG-LS prediction function and a 16×16 pixels sized image. If the image is "split" into one single 16×16 pixels sized block, and if the technique proposed in the invention is not applied, we have seen that the number of required cycles was 31. Conversely, if the block is divided into 16 4×4 sized blocks, each requiring 7 cycles, then processing of the entire image requires 16×7=112 cycles.

Hence, it is essential to reduce the number of cycles to process the small blocks. Indeed, a hardware decoder shall be designed to process, in real-time, the "worst case" that occurs in an encoded data stream, that is to say that one of an image split into blocks with a minimum size.

Referring to FIGS. 8D to 8G, we see that the implementation of the invention with a splitting of the current block into 2 areas allows reducing the processing cost below 0.25 cycle per element.

5.3 Method for Encoding or Decoding an Image

FIGS. 9 to 14 present a method for encoding or decoding at least one image according to different variants of the invention. These variants implement the main steps of processing a block according to the invention which have just been described with reference to FIGS. 2 to 8.

5.3.1 Serial Encoding or Decoding Method

FIG. 9 presents steps of a method for encoding or decoding an image according to a serial or sequential mode. For example, such an encoding/decoding method is implemented by an encoding/decoding device as described with reference to FIG. 13. In the following description, consider a sequence of images $I_1, I_2, \ldots, I_N$ to be encoded supplied at the input of the encoding method or an encoded data stream/file supplied at the input of the decoding method. Of course, the invention also applies to encoding/decoding of a fixed image.

In a known manner, encoding of the sequence of images $I_1, I_2, \ldots, I_N$ is done image by image according to an encoding order established beforehand and known to the decoder. For example, the images may be encoded in the temporal order $I_1, I_2, \ldots, I_N$ or according to another order, for example $I_1, I_3, I_2, \ldots, I_N$.

At a non-represented step, an image $I_k$ to be encoded of the sequence of images $I_1, I_2, \ldots, I_N$ is split into blocks with a maximum size. Each block with a maximum size may be split again into smaller blocks. For example, a block with a maximum size has a 32×32 pixels size. Such a bock with a maximum size may be divided into square or rectangular sub-blocks, having for example a 16×16, 8×8, 4×4, 16×8, 8×16 . . . size.

On the decoder side, a step of reading the encoded data allows obtaining a piece of information relating to the performed splitting.

At a step C0, a block B, called current block, to be encoded/decoded of an image $I_k$ is selected according to a predetermined scanning order of the image $I_k$, known to the encoder and to the decoder, for example the lexicographic order.

During a step C1, we check whether the current block B is to be processed according to the DPCM technique of the invention or according to another prediction mode such as a conventional intra or inter prediction mode as described for example in the HEVC standard. In a known manner, the test may consist in comparing a rate-distortion cost of the current block according to each of the modes and in selecting that one which obtains the lowest cost. A piece of information, such as an indicator (flag), on the selected prediction mode is encoded.

On the decoder side, the information is read in the compressed file or the encoded data stream in order to determine whether the current block is to be decoded according to a conventional mode (intra or inter decoding as described in the HEVC standard), or according to the DPCM mode of the invention.

In the case where the identified mode is a conventional prediction mode, the next step is step C2 of encoding (respectively decoding) in a conventional mode, known to those skilled in the art. It will not be described further.

Otherwise, if the obtained prediction mode is the DPCM mode according to the invention, the next step is step C3 of obtaining a split of the current block. During this step, the current block is divided into several areas according to one of the variants of the invention described in section 5.2. According to a first example described in section 5.2.3, the current block B is split into two areas Z1 and Z2, defined as follows:

An element X(lin,col) of the block B belongs to the first area Z1 if lin+col<H+1 with H the number of rows. Otherwise, the pixel belongs to the second area Z1. The areas Z1 and Z2 are separated by a diagonal boundary Fr.

According to a second example described in section 5.2.1, the block B is divided into two areas Z1 and Z2, such that an element X(lin,col) belongs to the first area if lin<H+1 where H is the number of rows. Otherwise, the element belongs to the second area.

At C4, the first area Z1 is selected as the current area. It should be noted that the order of processing the areas of the block B is arbitrary, to the extent that these are encodable/decodable independently of each other.

Step C5 of encoding the area Z1 will be described hereinafter with reference to FIG. 11. Step D5 of decoding the area Z1 will be described hereinafter with reference to FIG. 12.

At C6, we check whether there are still areas Zi to be encoded. In the considered example, there is still Z2. Hence, we return back to step C4 to select the area Z2. Afterwards, it is encoded or decoded, were appropriate, at C5/D5. At C6, the test of the last area is satisfactory.

The next step C7 checks whether there are still blocks to be processed. If this is the case, we return back to step C0 of selecting a new current block. Otherwise, the processing ends at C8.

5.3.2 Parallel Encoding or Decoding Method

FIG. 10 presents steps of a method for encoding or decoding an image according to a parallel mode.

The steps of selecting a block C0, checking the prediction mode C1, conventional encoding/decoding C2 and splitting into areas C3 remain unchanged.

Step C4 of selecting an area to be processed is replaced with a step C4' of distributing the areas between the computing machines or processing units that are available in the encoder/decoder. In the example of FIG. 10, we have N processing units to process the N areas of the current block, such that one area Zi is assigned to each processing unit UTi. This parallelisation is made possible by the invention, which carries out the prediction of one area independently of the other areas of the current block.

Of course, the invention is not limited to this example and applies to an encoder or decoder comprising a number of processing units that is smaller than the number of areas to be processed. In this case, we check at C6 whether there are still areas of the block to be processed. If so, the method returns back to step C4' of distributing the areas between the processing units. Otherwise, the next step is step C7 of checking the last block. If there are still blocks to be processed, we return back to step C0, otherwise the method ends at C8.

5.3.3 Encoding of an Area of the Current Block

Step C5 of encoding an area Zi of the current block according to an embodiment of the invention is now detailed with reference to FIG. 11.

At C51, at least one element or pixel x is selected in the area Zi. A scanning order is defined for the pixels of the current area. This scanning order is known per se and is predetermined. In particular, it is determined by the pixels used for the prediction of the current pixel and which shall be available in their decoded form (and therefore shall have been proceeded before). Thus, a conventional scanning order is the lexicographic order, which works for the previously-described local prediction functions.

For this selected element X, called current element, a value P(X) is predicted at C52 from at least one neighbouring predictor element already processed by applying a prediction function f, as previously described in section 5.2.

At C53, the value of the prediction residue R(X)=X P(X) is calculated. Afterwards, the value R(X) is quantized at C54 using for example a scalar quantization known per se. A quantized value Q(R(X)) is obtained.

At C55, the quantized residue Q(R(X)) is encoded using known means such as a Huffman encoder or an arithmetic encoder and the obtained encoded data are inserted in a stream or a file.

At C56, the decoded value D(X) of the current element X is calculated by carrying out the reverse operations. This value is stored in memory so as to be available for the prediction of next elements of the current area, or of the image.

If the dequantizer associated to the quantizer used at the previous step is referred to as QI, the decoded value D(X) of X is: D(X)=P(X)+QI(Q(R(X)))

During a step C57, we check whether the current element is the last one to be processed in the area Zi. If so, the processing ends. Otherwise, the next step is step C51 of selecting an element to be encoded.

5.3.4 Decoding of an Area of the Current Block

Step D5 of decoding an area Zi of the current block according to an embodiment of the invention is detailed now with reference to FIG. 12.

At D51, at least one element or pixel X in the area Zi is selected as previously described in section 5.3.3 for encoding.

For this selected element X, called current element, a value P(X) is predicted at D52 from at least one neighbouring predictor element already processed by applying a prediction function f, as previously described in section 5.2 for encoding.

At D53, the quantized residue Q(R(X)) is read in the encoded data and it is decoded at D54 using known means, the reverse of those implemented on the encoder side.

At D55, the dequantized value R(X) of the prediction residue is calculated. If the dequantizer associated to the quantizer used at the encoder is referred to as QI, the dequantized value of R(X) is QI(Q(R(X))).

At D56, the decoded value D(X) of the current element X is calculated by adding the predicted value to the dequantized residue: D(X)=P(X)+QI(Q(R(X))).

During a step D57, we check whether the current element is the last one to be processed in the area Zi. If so, the processing ends at D58. Otherwise, the next step is step D51 of selecting a next element to be decoded.

5.3.5 Variants of Encoding or Decoding of a Current Block

Referring to FIGS. 13 and 14, a variant of encoding or decoding a current block is now described. FIG. 13 presents the steps of a method for encoding or decoding an image implementing this variant according to a serial mode. FIG. 14 presents the steps of a method for encoding or decoding an image implementing this variant according to a parallel mode.

When the prediction mode is the DPCM mode, we obtain during an additional step C11 the prediction function f to be applied to the elements of the current block to predict its elements, in a list of available functions. For example, the list comprises the horizontal prediction function, the vertical prediction function and the JPEG-LS prediction function or only two of these functions. Of course, the invention is not limited to this example and the list may contain prediction functions other than those described before.

On the encoder side, the listed prediction functions are tested for example by calculating for each one the induced rate-distortion cost. The selected prediction function f is that one associated to the lowest rate-distortion cost. The next steps C3 and C5 or C51 to C5N make use of the knowledge of this information. In particular, step C3 of splitting the current block into areas takes into account this prediction function indication to adapt the performed splitting. Indeed, as described before, each selected prediction function conditions a particular splitting of the block that will allow minimising the number of machine cycles that are required for processing the current block. However, step C4 of selecting an area to be processed or respectively C4' of distributing the areas to be processed over the available processing units, is independent of the selection of the prediction function f, since, according to the invention, the areas split in the current block are encodable or decodable independently of each other. The encoding step C5 is also adapted, since the prediction of each of the areas is carried out with the selected prediction function.

Advantageously, the selected prediction function f is transmitted to the decoder in the form of a specific indicator which is encoded and inserted in the encoded data stream/ file. For example, this indicator is in the form of a rank of the prediction function in the list. Of course, this indicator is inserted only when the current block is encoded in the DPCM mode.

On the decoder side, step D11 comprises reading of the prediction function indicator in the encoded data stream or file and decoding thereof. Of course, such an indicator is read only if the block is to be decoded in the DPCM mode. The prediction function f is obtained from the decoded specific indicator.

In a similar way as with the encoder, the next steps D3, and D5 or D51 to D5N take into account the obtained prediction function f to adapt their processing of the current block, whereas steps D4 or D4' are not affected.

According to another aspect of the invention, there is provided a method for encoding at least one image, split into blocks of elements, using a Differential Pulse-Code Modulation (DPCM).

According to a general feature of this other aspect of the invention, the encoding method comprises the insertion, in an encoded data stream (bitstream), of an encoded information representative of a so-called prediction function that allows obtaining at least one element of the block of elements from another element, said encoded information being inserted if the prediction function belongs to a predetermined list of prediction functions.

In the case where the prediction function does not belong to a predetermined list of prediction functions, said encoded information is not inserted.

Preferably, the predetermined list of prediction functions comprises at least one of the following prediction functions:
Horizontal direction prediction function,
Vertical direction prediction function, or
JPEG-LS prediction function.

Preferably, said element is a previously encoded element of said block of the image.

An embodiment of this method is illustrated by FIG. 15. Consider an image I to be encoded. It is split into blocks. At C150, a block B to be encoded is selected. At C151, a prediction function to be applied to the block B to predict its elements is obtained in a list of available functions. For example, the list comprises the horizontal prediction function, the vertical prediction function and the JPEG-LS prediction function or only two of these functions. Of course, the invention is not limited to this example and the list may contain prediction functions other than those described before. For example, the listed prediction functions are tested by calculating for each one the induced rate-distortion cost. The selected prediction function f is that one associated to the lowest rate-distortion cost.

At C152, a piece of information representative of the obtained prediction function f is encoded and inserted in the stream or file BS.

At C153, at least one element or pixel x is selected in the block B. A scanning order is defined for the pixels of the current area. This scanning order is known per se and is predetermined. In particular, it is determined by the pixels used for the prediction of the current pixel and which shall be available in their decoded form (and therefore shall have been proceeded before). Thus, a conventional scanning order is the lexicographic order, which works for the previously-described local prediction functions.

For this selected element X, called current element, a value P(X) is predicted at C154 from at least one neighbouring predictor element already processed by applying a prediction function f.

At C155, the value of the prediction residue is obtained by calculating R(X)=X P(X). Afterwards, the value R(X) is quantized at C156 using for example a scalar quantization known per se. A quantized value Q(R(X)) is obtained.

At C157, the quantized residue Q(R(X)) is encoded using known means such as a Huffman encoder or an arithmetic encoder and the obtained encoded data are inserted in a stream or a file BS.

At C158, the decoded value D(X) of the current element X is calculated by carrying out the reverse operations. This value is stored in memory M' so as to be available for the prediction of next elements of the block B, or of the image.

If the dequantizer associated to the quantizer used at the previous step is referred to as QI, the decoded value D(X) of X is: D(X)=P(X)+QI(Q(R(X)))

During a step C159, we check whether the current element X is the last one to be processed in the area Zi. If so, we check at C160 whether there are still blocks to be processed. If this is the case, the processing ends. Otherwise, the previous steps are repeated.

According to another aspect of the invention, there is provide a method for decoding at least one encoded image within an encoded data stream using a Differential Pulse-Code Modulation (DPCM). Said image is split into blocks of elements. According to a general feature of this other aspect of the invention, the decoding method comprises the obtainment from the stream of a piece of information representative of a so-called prediction function which allows obtaining at least one element of the block of elements from another element, said prediction function belonging to a predetermined list of prediction functions.

In the case where the prediction function does not belong to a predetermined list of prediction functions, said information is not obtained.

Preferably, the predetermined list of prediction functions comprises at least one of the following prediction functions:
Horizontal direction prediction function,
Vertical direction prediction function, or
JPEG-LS prediction function.

Preferably, said element is a previously decoded element of said block of the image.

An embodiment of this method is illustrated by FIG. 16. Consider an encoded data stream or a compressed file BS. The encoded data are representative of an image I to be decoded. At D160, a block B to be processed in the image I is selected and a piece of information ICf representative of a prediction function to be applied to the block B is read in the stream. At D161, the information ICf is decoded and the prediction function f is obtained at D162. At D163, an element or pixel X is selected in the block B.

For this selected element X, called current element, a value P(X) is predicted at D164 according to the DPCM technique from at least one neighbouring predictor element already processed by applying a prediction function f.

At D165, the quantized residue Q(R(X)) is read in the encoded data and it is decoded at D166 using known means, the reverse of those implemented on the encoder side.

At D167, the dequantized value R(X) of the prediction residue is calculated. If the dequantizer associated to the quantizer used at the encoder is referred to as QI, the dequantized value of R(X) is QI(Q(R(X))).

At D168, the decoded value D(X) of the current element X is calculated by adding the predicted value to the dequantized residue: D(X)=P(X)+QI(Q(R(X))).

During a step D169, we check whether the current element is the last one to be processed in the block B. If so, we check at D170 whether there are still blocks to be processed in the image I. If this is the case, the processing ends. Otherwise, the precious steps are repeated.

An advantage of this aspect of the invention lies in selecting the prediction function that best suits the current block, which allows improving the quality of the prediction and therefore reducing the residue to be encoded.

5.4 Encoding and Decoding Devices

According to a particular embodiment of the invention illustrated by FIG. 17A, the steps of the encoding method are implemented by computer program instructions. For this purpose, the encoding device 100 or the decoding device 200 has the conventional architecture of a computer and comprises in particular a memory MEM 101, 201, a processing unit UT 102, 202, equipped for example with at least one microprocessor P1, and driven by the computer program Pg stored in memory MEM. The computer program Pg comprises instructions to implement the steps of the encoding or decoding method as described hereinabove, when the program is executed by the processor.

Upon initialisation, the code instructions of the computer program Pg are loaded for example in a RAM memory before being executed by the processor. In particular, the processor of the processing unit UT implements the steps of the encoding or decoding method described hereinabove in these different variants, according to the instructions of the computer program Pg.

According to another embodiment of the invention, illustrated by FIG. 17B, the processing unit comprises several processors P1 to PN, with N an integer greater than or equal to 2. The program Pg' comprises instructions to implement the steps of the encoding or decoding method as described hereinabove, when the execution of the method is carried out by the processors P1 to PN, as described in the so-called "parallel" embodiment of section 5.3.2 with reference to FIG. 10. According to this embodiment, a "master" processor, for example P1, executes the encoding method and distributes, at C'4, the processing of the areas over the available processors, so that the encoding/decoding steps C51/D51 . . . C5N/D5N are executed in parallel. Advantageously, the device 100, 200 comprises several memories MEM2 to MEMN, in addition to the memory M, adapted to temporarily store the predictions of the elements of the current area, their (de)quantized residues, their (de/en)coded values, etc.

According to another particular embodiment of the invention illustrated by FIG. 18, the encoding or decoding method according to the invention is implemented by functional modules. For this purpose, the device 100, 200 further comprises:
a module CUT for splitting the block into at least two areas;
a module PROC for processing at least one said area, comprising scanning of the elements of the area according to a predetermined scanning order, and for a scanned current element:
The selection SEL of at least one neighbouring predictor element previously encoded or decoded according to a predetermined neighbouring function;
The prediction PRED of the current element into a predicted current element:
from the at least one neighbouring predictor element, if the at least one neighbouring predictor element belongs to said area;
from at least one replacement value, otherwise.

The processing unit UT cooperates with the above-described different functional modules and the memory MEM in order to implement the steps of the encoding or decoding method.

The above-described different functional modules may be in a hardware and/or software form. When in a software form, such a functional module may comprise one or several processor(s), a memory and program code instructions to implement the function corresponding to the module when the code instructions are executed by one/the processor. When in the hardware form, such a functional module may be implemented by any type of suitable encoding circuits, such as, without limitation, microprocessors, Digital Signal Processors (DSP), Application Specific Integrated Circuits (ASIC), Field Programmable Gate Arrays (FPGA) circuits, a wiring logic units.

These modules are driven by the processor of the processing unit UT.

Advantageously, the functional module PROC may comprise several processors arranged so as to process the areas split in the current block according to the invention in parallel.

Advantageously, the device 100 and/or the device 200 may be embedded in a terminal equipment ET 10, such as a smartphone, a tablet, a television set, a personal computer. The device 100, 200 is then arranged so as to cooperate at least with the following module of the terminal ET:
   a data emitter/receiver module E/R1, through which the bitstream TB or the compressed file FC is transmitted in a telecommunications network, for example a wired network or a radio network; and
   a module M for storing M the image or the sequence of images to be encoded, the obtained encoded data stream/file or the decoded image or sequence of images.

It goes without saying that the embodiments that have been described hereinabove have been provided for merely indicative and non-limiting purposes, and that numerous modifications may be easily made by those skilled in the art yet without departing from the scope of the invention.

The invention claimed is:

1. A method for encoding or decoding at least one image, each image being split into blocks of elements, said method being performed by an encoding or decoding device and comprising, for at least one block:
   splitting the block into at least two areas; and
   processing at least one said area, comprising scanning the elements of the area according to a predetermined scanning order, and for at least one scanned element, called current element:
      selecting at least one predictor element previously encoded or decoded according to a prediction function;
      predicting the current element into a predicted current element:
         from the at least one predictor element, if the at least one predictor element belongs to said area;
         from at least one replacement value obtained independently of the at least one other area from at least one other predictor element, selected in a previously encoded or decoded block in a vicinity of the current block, otherwise;
      obtaining a residue element by subtraction of the predicted current element from the current element; and
      encoding the residue element and inserting the encoded residue element in encoded data representative of said image.

2. The method according to claim 1, wherein, the current element being located on a row (lin) and a column, the predicting comprises selecting the previously encoded or decoded element located on the same column and on the previous row (lin−1) and a boundary between said at least two areas is horizontal.

3. The method according to claim 2, wherein, for a block comprising H rows, the current block is split into a first area and a second area, such that the elements of the first area meet the condition lin<H/2.

4. The method according to claim 1, wherein, the current element being located on a row and a column (col), the predicting comprises selecting the previously encoded or decoded element located on the same row and on the previous column (col−1) and a boundary between said at least two areas is a vertical line.

5. The method according to claim 4, wherein, for the block comprising W columns, the current block is split into a first area and a second area, such that the elements of the first area meet the condition col<W/2.

6. The method according to claim 1, wherein, the current element being located on a row (lin) and a column (col), the prediction function selects a previously processed first element on the same row (lin) and on the previous column (col−1), a previously processed second element on the previous row (lin−1) and on the same previous column (col) and a previously processed third element on the previous row and column (lin−1, col−1) and a boundary between said at least two areas is diagonal.

7. The method according to claim 6, wherein, for a block comprising H rows and W columns, the current block is split into two areas, such that the elements of the first area meet the condition lin+col<(H+W)/2+1.

8. The method according to claim 1, wherein the method further comprises obtaining a prediction function for the predicting in a list of available prediction functions, and wherein at least the splitting of the current block into areas or the processing of at least one area depends on the obtained prediction function.

9. The encoding method according to claim 8, wherein the method further comprises encoding an indicator of the obtained prediction function.

10. The decoding method according to claim 8, wherein the method comprises decoding encoded data representative of an indicator of a prediction function used for the predicting, the prediction function being obtained from the indicator.

11. The method according to claim 1, wherein the at least one replacement value for the current block is encoded and transmitted in encoded data or obtained by reading encoded data.

12. The method according to claim 1, wherein said method comprises, for the current element,
   obtaining a residue of the current element by reading encoded data representative of said image; and
   rebuilding a decoded current element from the obtained residue and the predicted current element.

13. A device for encoding or decoding at least one image, each image being split into blocks of elements, said device comprising at least one computing machine dedicated or configured, for at least one block, to:
   split the block into at least two areas; and
   process at least one said area, comprising scanning the elements of the area according to a predetermined scanning order, and for at least one scanned element, called current element:
      selecting at least one predictor element previously encoded or decoded according to a prediction function;
      predicting the current element into a predicted current element:
         from the at least one predictor element, if the at least one predictor element belongs to said area;
         from at least one replacement value obtained independently of the at least one other area from at least one other predictor element, selected in a previously encoded or decoded block in a vicinity of the current block, otherwise;
      obtaining a residue element by subtraction of the predicted current element from the current element; and encoding the residue element and inserting the encoded residue element in encoded data representative of said image.

14. The encoding or decoding device according to claim 13, wherein, the current block being split into at least one first and one second areas, and the at least one computing machine comprises at least one first computing machine dedicated or configured to process the first area and one second computing machine dedicated or configured to process the second area.

15. A non-transitory computer-readable medium comprising a computer program product stored thereon and having instructions for implementing a method of encoding or decoding at least one image when the instructions are executed by a processor of an encoding or decoding device, wherein each image is split into blocks and the instructions configure the encoding or decoding device to, for at least one block:

split the block into at least two areas; and
process at least one said area, comprising scanning the elements of the area according to a predetermined scanning order, and for at least one scanned element, called current element:
  selecting at least one predictor element previously encoded or decoded according to a prediction function;
  predicting the current element into a predicted current element:
    from the at least one predictor element, if the at least one predictor element belongs to said area;
    from at least one replacement value obtained independently of the at least one other area from at least one other predictor element, selected in a previously encoded or decoded block in a vicinity of the current block, otherwise;
  obtaining a residue element by subtraction of the predicted current element from the current element; and
  encoding the residue element and inserting the encoded residue element in encoded data representative of said image.

16. A method for encoding or decoding at least one image, each image being split into blocks of elements, said method being performed by an encoding or decoding device and comprising, for at least one block:

splitting the block into at least two areas; and
processing at least one said area, comprising scanning the elements of the area according to a predetermined scanning order, and for at least one scanned element, called current element:
  selecting at least one predictor element previously encoded or decoded according to a prediction function; and
  predicting the current element:
    from the at least one predictor element, if the at least one predictor element belongs to said area;
    from at least one replacement value obtained independently of the at least one other area, otherwise,
wherein the current element being located on a row (lin) and a column (col), the prediction function selects a previously processed first element on the same row (lin) and on the previous column (col−1), a previously processed second element on the previous row (lin−1) and on the same previous column (col) and a previously processed third element on the previous row and column (lin−1, col−1) and a boundary between said at least two areas is diagonal, and
wherein or a block comprising H rows and W columns, the current block is split into two areas, such that the elements of the first area meet the condition lin+col< (H+W)/2+1.

* * * * *